(12) United States Patent
Galburt et al.

(10) Patent No.: US 7,389,155 B2
(45) Date of Patent: Jun. 17, 2008

(54) METHOD AND SYSTEM FOR IMPROVED TRAJECTORY PLANNING AND EXECUTION

(75) Inventors: Daniel Galburt, Wilton, CT (US); Todd Bednarek, Southbury, CT (US)

(73) Assignee: ASML Holding N.V., Veldhoven (NL)

( * ) Notice: Subject to any disclaimer, the term of this patent is extended or adjusted under 35 U.S.C. 154(b) by 113 days.

(21) Appl. No.: 11/002,429

(22) Filed: Dec. 3, 2004

(65) Prior Publication Data

US 2005/0077484 A1    Apr. 14, 2005

Related U.S. Application Data

(63) Continuation of application No. 10/299,855, filed on Nov. 20, 2002, now Pat. No. 6,845,287.

(51) Int. Cl.
*G06F 19/00* (2006.01)
(52) U.S. Cl. ........................................ 700/186; 700/121
(58) Field of Classification Search ................... 700/63, 700/68, 61, 69, 119, 189, 112, 121, 186, 700/188, 89, 302, 263; 355/402, 53, 55; 250/492.2; 430/269; 702/100, 29; 708/313
See application file for complete search history.

(56) References Cited

U.S. PATENT DOCUMENTS

| | | | |
|---|---|---|---|
| 5,625,267 A * | 4/1997 | Gregory | 318/625 |
| 5,996,437 A | 12/1999 | Novak et al. | |
| 6,008,610 A | 12/1999 | Yuan et al. | |
| 6,069,684 A | 5/2000 | Golladay et al. | |
| 6,260,282 B1 | 7/2001 | Yuan et al. | |
| 6,285,438 B1 | 9/2001 | Hazelton et al. | |

(Continued)

FOREIGN PATENT DOCUMENTS

EP    1 037 114 A2    9/2000

(Continued)

OTHER PUBLICATIONS

Wronosky et al., Wafer and Reticle position system for the Extreme Ultrviolet Lithogrphy Engineering Test Stand, Feb. 1, 2002, Sandia National Lab. et al., p. 1-11.*

(Continued)

*Primary Examiner*—Kidest Bahta
(74) *Attorney, Agent, or Firm*—Sterne, Kessler, Goldstein & Fox P.L.L.C.

(57) ABSTRACT

A trajectory planning process receives data generated by high-level control software. This data defines positions and scan velocities. The trajectory planning process creates sequences of constant acceleration intervals that allow critical motions to be executed at maximum throughput. The trajectory planning process outputs a profile. A profile executor, using the profile output by the trajectory planner process, generates continuous synchronized, filtered, multi-axis position and acceleration commands that drive control servos. Time intervals generated by the trajectory planner are quantized to be integer multiples of a real time clock period. The trajectory planner outputs have infinite jerk, but are smoothed by filters in the profile executor to both limit jerk and minimize servo-tracking errors. The trajectory planner allows time for the profile executor filters, but does not restrict fine tuning of the shape of these filters, provided that the width of the tuned filter does not exceed the allowed time.

19 Claims, 23 Drawing Sheets

U.S. PATENT DOCUMENTS

| | | | |
|---|---|---|---|
| 6,320,345 B1 | 11/2001 | Yuan et al. | |
| 6,360,078 B1 * | 3/2002 | Driedger et al. | 455/67.16 |
| 6,509,953 B1 | 1/2003 | Saiki et al. | |
| 6,674,510 B1 * | 1/2004 | Jasper et al. | 355/55 |
| 2003/0055855 A1 * | 3/2003 | Wiener | 708/313 |

FOREIGN PATENT DOCUMENTS

| | | | |
|---|---|---|---|
| EP | 1037114 A2 * | 9/2000 | |
| JP | 11-312643 | 9/1999 | |
| JP | 2001-250757 | 9/2001 | |
| WO | WO 02/056468 A2 | 7/2002 | |

OTHER PUBLICATIONS

Todd J. Bednarek, "Optomized Trajectory Planning for Robot Control," Rensselaer at Hartford Library, Hartford, Connecticut, Apr. 1999, pp. i-v and 1-22.

Australian Patent Office Search Report mailed Apr. 5, 2004 for SG 200306775-8, 3 pages.

Pending U.S. Appl. No 09/923,397, filed Aug. 8, 2001.

Pending U.S. Appl. No. 09/757,622, filed Jan. 11, 2001.

European Search Report dated Nov. 2, 2005 from corresponding European Application No. 03026145.7.

English-language abstract of Japanese Publication No. 2000-040658, published Feb. 2, 2000.

* cited by examiner

METHOD AND SYSTEM FOR IMPROVED TRAJECTORY PLANNING AND EXECUTION

CROSS-REFERENCE TO RELATED APPLICATIONS

This application is a continuation of U.S. patent application Ser. No. 10/299,855, filed Nov. 20, 2002 now U.S. Pat. No. 6,845,287, titled "Method, System, and Computer Program Product for Improved Trajectory Planning and Execution," hereby incorporated by reference herein in its entirety.

BACKGROUND OF THE INVENTION

1. Field of the Invention

The invention described herein relates to trajectory planning and execution for movable components of a photolithography system.

2. Related Art

Many industrial processes involve motion along trajectories that are defined by precise positions at specific times. Photolithography is an example of such a process. In a photolithography process, an illumination source projects an illumination beam. The beam passes through, or is reflected off of, a reticle to enable the transfer of a reticle image from the reticle to a substrate, such as a semiconductor wafer.

Scanning techniques are employed in photolithography processes to project a reticle image into a substrate. These scanning techniques involve moving a reticle across an illumination slot to allow the reticle image to be exposed onto a substrate that is simultaneously moving. Reticles and substrates are exposed on stages that are capable of motion in one or more dimensions.

In general, digitally-calculated motion trajectories enable high-precision multi-axis motion control systems to achieve high throughput. Of special interest are the motion trajectories followed by the wafer and reticle in a step and scan lithography tool during the process in which the reticle pattern is imaged and exposed onto the wafer surface. The entire wafer surface is exposed in a sequence of field scans. The exposure of each field requires that the wafer and reticle be simultaneously scanned across the exposing field of the imaging optics at precisely synchronized, constant velocities. The ratio of the reticle and wafer velocities must exactly match the magnification of the imaging optics.

To maximize system throughput, it is desirable to expose a wafer in the minimum possible time. In a typical trajectory used to expose a wafer, after each field exposure, the wafer stage must be asynchronously stepped from an initial state (i.e., a position and velocity) at the end of a field scan, to a new state (i.e., a new position and velocity) at the start of the next field scan. Similarly, the reticle stage must also be asynchronously stepped from an initial state at the end of a field scan, to a new state at the start of the next field scan. Consequently, minimizing the amount of time between scans would improve system throughput. A system and method is therefore needed to plan and execute optimal trajectories for photolithography components for the intervals between constant velocity scans.

BRIEF SUMMARY OF THE INVENTION

The invention described herein consists of a method, system, and computer program product for non-real-time trajectory planning and real-time trajectory execution. A trajectory planning process receives data generated by high-level control system. The high-level control system can be implemented in software. This data defines positions and scan velocities, where multiple axis motion must be precisely synchronized. The trajectory planning process creates sequences of constant acceleration intervals that allow critical motions to be executed at maximum throughput. The output of a trajectory planning process is known as a profile. A profile executor, using the profile output by the trajectory planner process, generates continuous, synchronized, filtered, multi-axis position and acceleration commands (i.e., execution data) that drive control servos.

All time intervals generated by the trajectory planner are quantized to be integer multiples of a real time clock period. The trajectory planner outputs have infinite jerk, but are smoothed by filters in the profile executor to both limit jerk and minimize servo-tracking errors. The trajectory planner allows time for the profile executor filters, but does not restrict fine tuning of the shape of these filters, provided that the width of the tuned filter does not exceed the allowed time.

The combined trajectory planning and execution processes allows the exposure sequence to be smoothly stopped and restarted after completing any individual field scan.

BRIEF DESCRIPTION OF THE FIGURES

The foregoing and other features and advantages of the invention will be apparent from the following, more particular description of a preferred embodiment of the invention, as illustrated in the accompanying drawings.

DETAILED DESCRIPTION OF THE INVENTION

A preferred embodiment of the present invention is now described with reference to the figures where like reference numbers indicate identical or functionally similar elements. Also in the figures, the left most digit of each reference number corresponds to the figure in which the reference number is first used. While specific configurations and arrangements are discussed, it should be understood that this is done for illustrative purposes only. A person skilled in the relevant art will recognize that other configurations and arrangements can be used without departing from the spirit and scope of the invention. It will be apparent to a person skilled in the relevant art that this invention can also be employed in a variety of other devices and applications.

I. Overview

The invention described herein comprises a non-real-time planning algorithm, and a real time execution algorithm. The trajectory planning process receives data generated by high-level control software. This data defines positions and scan velocities, where multiple axis motion must be precisely synchronized. The trajectory planning process creates sequences of constant acceleration intervals that allow critical scanning motions to be executed at maximum throughput. The profile executor, using trajectory planner outputs (i.e., the profile), generates continuous, synchronized, filtered, multi-axis position and acceleration commands that drive control servos. All time intervals generated by the trajectory planner are quantized to be integer multiples of a real time clock period. The trajectory planner outputs have infinite jerk, which is smoothed by the filters in the profile executor to both limit jerk and minimize servo-tracking errors. The trajectory planner allows time for the profile executor filters, but does not restrict fine tuning of the shape of these filters, provided that the width of the tuned filter does not exceed the allowed time.

Figure 1:
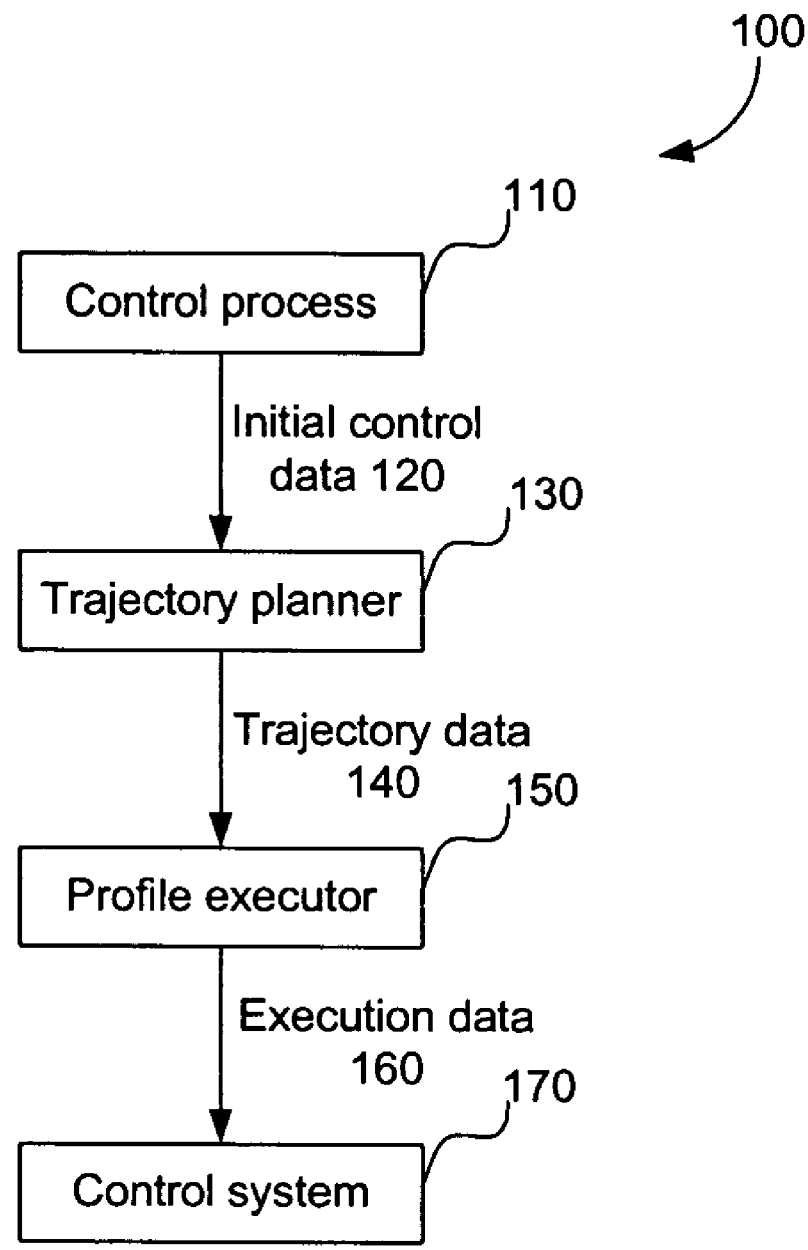
FIG. 1 is a block diagram illustrating the fundamental modules of an embodiment of the invention, and the data flow between them.

The invention is illustrated generally in FIG. 1. A control process 110 is responsible for providing initial control data 120 to a trajectory planner 130. Initial control data 120 includes information necessary to begin trajectory planning for an interval between constant velocity scans. Because this interval connects two scans, it is sometimes referred to as a link. Initial control data 120 includes the starting point of a scan, the required distances and velocities of a scan, and stopping points. Given the initial control data 120, trajectory planner 130 then produces trajectory data 140, also known as a profile. Trajectory data 140 includes definition of quantized time intervals of constant acceleration for the link, as well as the acceleration during these intervals. Trajectory data 140 also includes the position and velocity at the start of each acceleration interval. Trajectory data 140 is then used by profile executor 150. Profile executor 150 uses trajectory data 140 to produce execution data 160. Execution data 160 is a real time data stream defining positions and accelerations. Execution data 160 represents a series of commands to control system 170. Control system 170 represents the electromechanical control mechanism used to move components of the photolithography system (e.g., the wafer stage and reticle stage) according to execution data 160.

Figure 2:
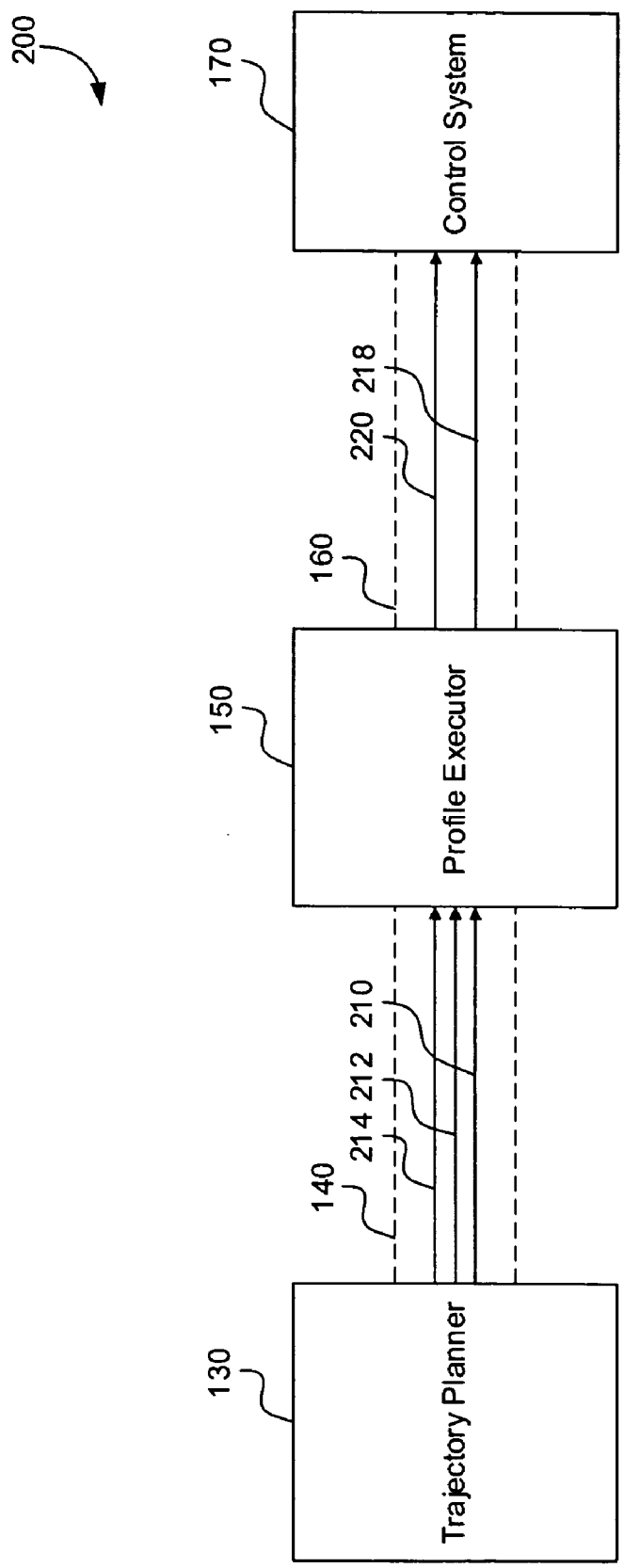
FIG. 2 illustrates the data flow between modules in greater detail, according to an embodiment of the invention.

FIG. 2 is a more detailed block diagram of the system of the invention. System 200 includes trajectory planner 130, profile executor 150, and control system 170. Trajectory planner 130 designs device trajectories in accordance with control data 120. This design results in the generation of trajectory data 140. Trajectory data 140 can be viewed as a state signal set that defines a trajectory for a device, such as a trajectory for a substrate stage or a reticle stage in a photolithography tool. Planner 130 can be implemented as a computer program product that is executed by a computer. However, planner 130 can also be implemented in hardware and/or firmware or a combination thereof. In an embodiment of the invention, trajectory planner 130 designs these trajectories in an off-line process. Thus, in the case of photolithography, trajectory data 140 is generated prior to commencement of substrate stage or reticle stage scanning operations.

Trajectory data 140 defines a plurality of constant acceleration states that govern the motion of a device, such as a substrate stage or a reticle stage, that is included in control system 170. Trajectory data 140 includes a position state signal 210, a velocity state signal 212, and an acceleration state signal 214. For each constant acceleration state, state signals 210, 212, and 214 have corresponding values. These constant acceleration states exist for variable length time intervals that are integer multiples of a slow clock period such as 1 millisecond.

As described above, trajectory data 140 includes position state signal 110, velocity state signal 112, and acceleration state signal 114. These state signals generated by trajectory planner 140 define motion in a single dimension for a device, such as a substrate stage or a reticle stage.

Relationships between these signals can be expressed as $P=P_i+\frac{1}{2}At^2+V_i t$ and $V=V_i+At$. In these expressions, where $P_i$ represents position state signal 210, P represents a position signal, A represents acceleration state signal 214, $V_i$ represents velocity state signal 212, and V represents a velocity signal. Position state signal 210 is a non-equidistantly sampled second order curve. Accordingly, velocity state signal 212 is a non-equidistantly sampled trapezoidal signal.

Acceleration state signal 214 includes a series of square and/or rectangular pulses that can have any amplitude and pulse width. These pulses correspond to transitions in velocity state signal 212 values. At the rising and falling edges of these pulses, acceleration state signal 214 has a first derivative that is large. This first derivative is referred to herein as "jerk". Since these rising and falling edges provide for square and/or rectangular pulses, acceleration state signal 214 has jerk values that are infinity (i.e., delta functions).

The values of velocity state signal 212 and acceleration state signal 214 only change at specific times defined by trajectory planner 130. Thus, instead of being represented by sets of samples that are uniformly spaced in time, these signals are represented by values corresponding to specific moments in time when acceleration state signal 214 changes. As described above, these moments are separated by time intervals that are integer multiples of the slow clock period.

Referring again to FIG. 1, profile executor 150 receives trajectory data 140 from trajectory planner 130 and converts these signals into an output signal set, execution data 160. Execution data 160 includes a real time position signal and a real time acceleration output signal. These output signals correspond to trajectory data 140, but are discrete time signals occurring at a fixed fast clock rate. An exemplary fast clock rate is 16 kHz. Other clock rates can also be used. Discrete time signals occurring at this fast clock rate have values spaced at 0.0625 millisecond time intervals. The process of increasing the clock rate of a discrete time signal is referred to herein as interpolation. Profile executor 150 sends execution data 160 to control system 170.

In generating execution data 160, profile executor 150 filters the state signals of trajectory data 140 to reduce excessive jerk, such as those described above. In so doing, profile executor 160, through filtering, avoids exciting certain resonances in control system 170 and produces discrete time signals at the fast clock rate. Since this fast clock rate is greater than the slow clock rate associated with trajectory data 140, profile executor 150 performs filtering and interpolation of state signals to produce execution data 160.

Execution data 160 includes a position output signal 218 and an acceleration output signals 220. Like state signals 210-214, these signals are discrete signals. However, unlike state signals 210-214, position signals 218 and acceleration signal 220 each have values that are spaced at uniform time intervals. These uniform time intervals are equal to one period of the fast clock rate described above.

Profile executor 150 is implemented as a computer program product that can be executed by a computer system. In an embodiment of the invention, this computer is a fixed precision arithmetic micro-controller, such as a SHARC® ADSP-21062 produced by Analog Devices, Inc. of Norwood, Mass.

The functions performed by trajectory planner 130, which is capable of calculating trajectories as shown in process 500, are preferably implemented in software. Alternatively, the same may be implemented using hardware or a combination of hardware and software.

Figure 3:
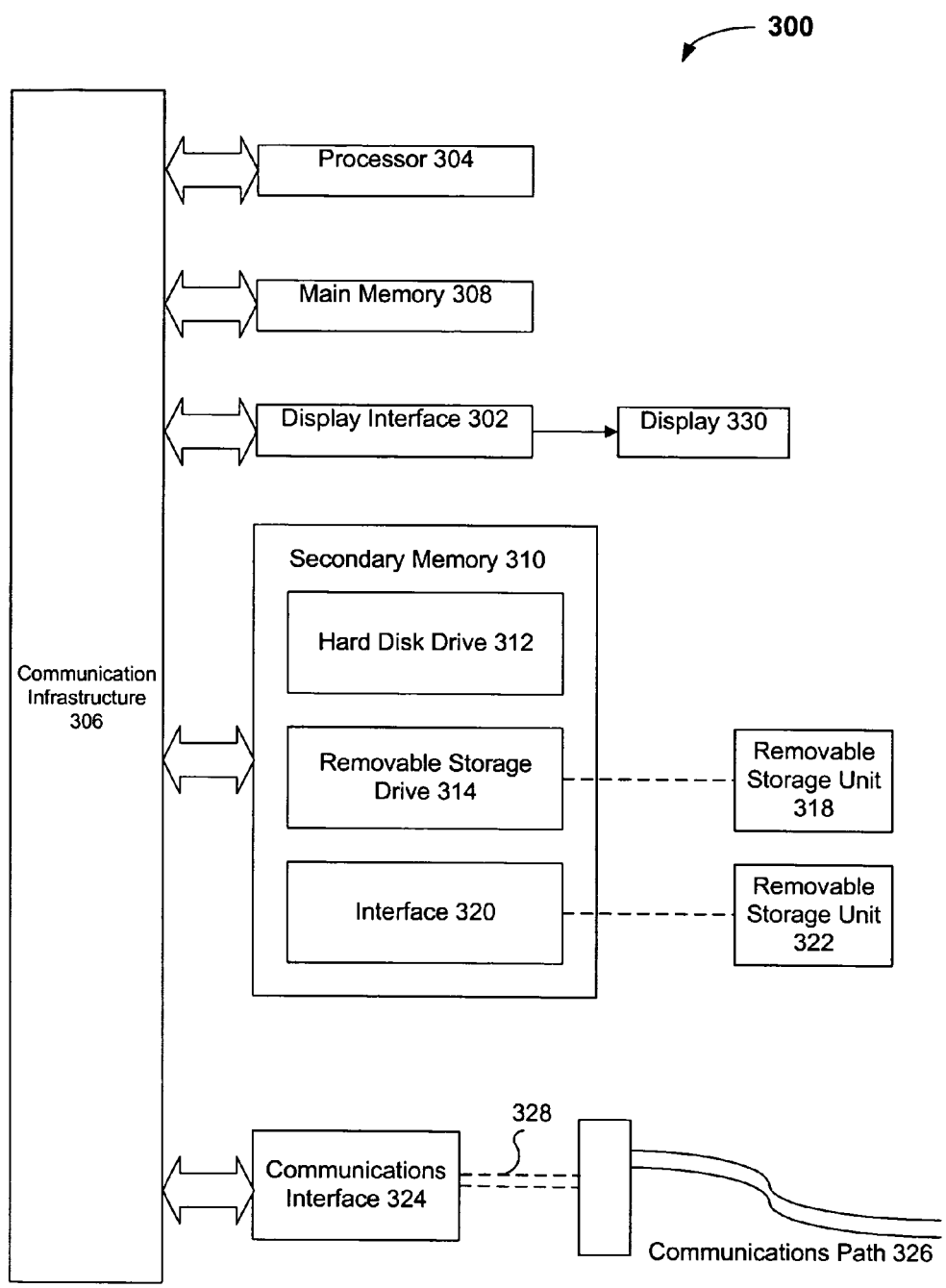
FIG. 3 illustrates a computing platform on which a software embodiment of the invention can execute.

An example of a computer system 300 is shown generally in FIG. 3. Such a computer system can be used to perform the processing of trajectory planner 130 or profile executor 150. The computer system 300 represents any single-processor computer. Single-threaded and multi-threaded computers can be used. Unified or distributed memory systems can be used.

The computer system 300 includes one or more processors, such as processor 304. One or more processors 304 can execute software implementing the operations described below in FIG. 5. Each processor 304 is connected to a communication bus 302 (e.g., cross-bar or network). Various software embodiments are described in terms of this exemplary computer system. After reading this description, it will become apparent to a person skilled in the relevant art how to implement the invention using other computer systems and/or computer architectures.

Computer system 300 also includes a main memory 306, preferably random access memory (RAM), and can also include a secondary memory 308. The secondary memory 308 can include, for example, a hard disk drive 310 and/or a removable storage drive 312, representing a floppy disk drive, a magnetic tape drive, an optical disk drive, etc. The removable storage drive 312 reads from and/or writes to a removable storage unit 314 in a well known manner. Removable storage unit 314 represents a floppy disk, magnetic tape, optical disk, etc., which is read by and written to by removable storage drive 312. As will be appreciated, the removable storage unit 314 includes a computer usable storage medium having stored therein computer software and/or data.

In alternative embodiments, secondary memory 308 can include other means for allowing computer programs or other instructions to be loaded into computer system 300. Such means can include, for example, a removable storage unit 322 and an interface 320. Examples can include a program cartridge and cartridge interface (such as that found in video game devices), a removable memory chip (such as an EPROM, or PROM) and associated socket, and other removable storage units 322 and interfaces 320 which allow software and data to be transferred from the removable storage unit 322 to computer system 300.

Computer system 300 can also include a communications interface 324. Communications interface 324 allows software and data to be transferred between computer system 300 and external devices via communications path 326. Examples of communications interface 320 can include a modem, a network interface (such as Ethernet card), a communications port, etc. Software and data transferred via communications interface 324 are in the form of signals which can be electronic, electromagnetic, optical or other signals capable of being received by communications interface 324, via communications path 326. Note that communications interface 324 provides a means by which computer system 300 can interface to a network.

The present invention can be implemented using software running (that is, executing) in an environment similar to that described above with respect to FIG. 3. In this document, the term "computer program product" is used to generally refer to removable storage unit 314, a hard disk installed in hard disk drive 310, or a carrier wave carrying software over a communication path 326 (wireless link or cable) to communication interface 324. A computer useable medium can include magnetic media, optical media, or other recordable media, or media that transmits a carrier wave. These computer program products are means for providing software to computer system 300.

Computer programs (also called computer control logic) are stored in main memory 306 and/or secondary memory 308. Computer programs can also be received via communications interface 324. Such computer programs, when executed, enable the computer system 300 to perform the features of the present invention as discussed herein. In particular, the computer programs, when executed, enable the processor 304 to perform the features of the present invention. Accordingly, such computer programs represent controllers of the computer system 300.

In an embodiment where the invention is implemented using software, the software can be stored in a computer program product and loaded into computer system 300 using removable storage drive 312, hard drive 310, or communications interface 324. Alternatively, the computer program product can be downloaded to computer system 300 over communications path 324. The control logic (software), when executed by the one or more processors 304, causes the processor(s) 304 to perform the functions of the invention as described herein.

In another embodiment, trajectory planner 130 and/or profile executor 150 are implemented primarily in firmware and/or hardware using, for example, hardware components such as application specific integrated circuits (ASICs). Implementation of a hardware state machine so as to perform the functions described herein will be apparent to persons skilled in the relevant art(s).

II. Trajectory Planning

Figure 4:
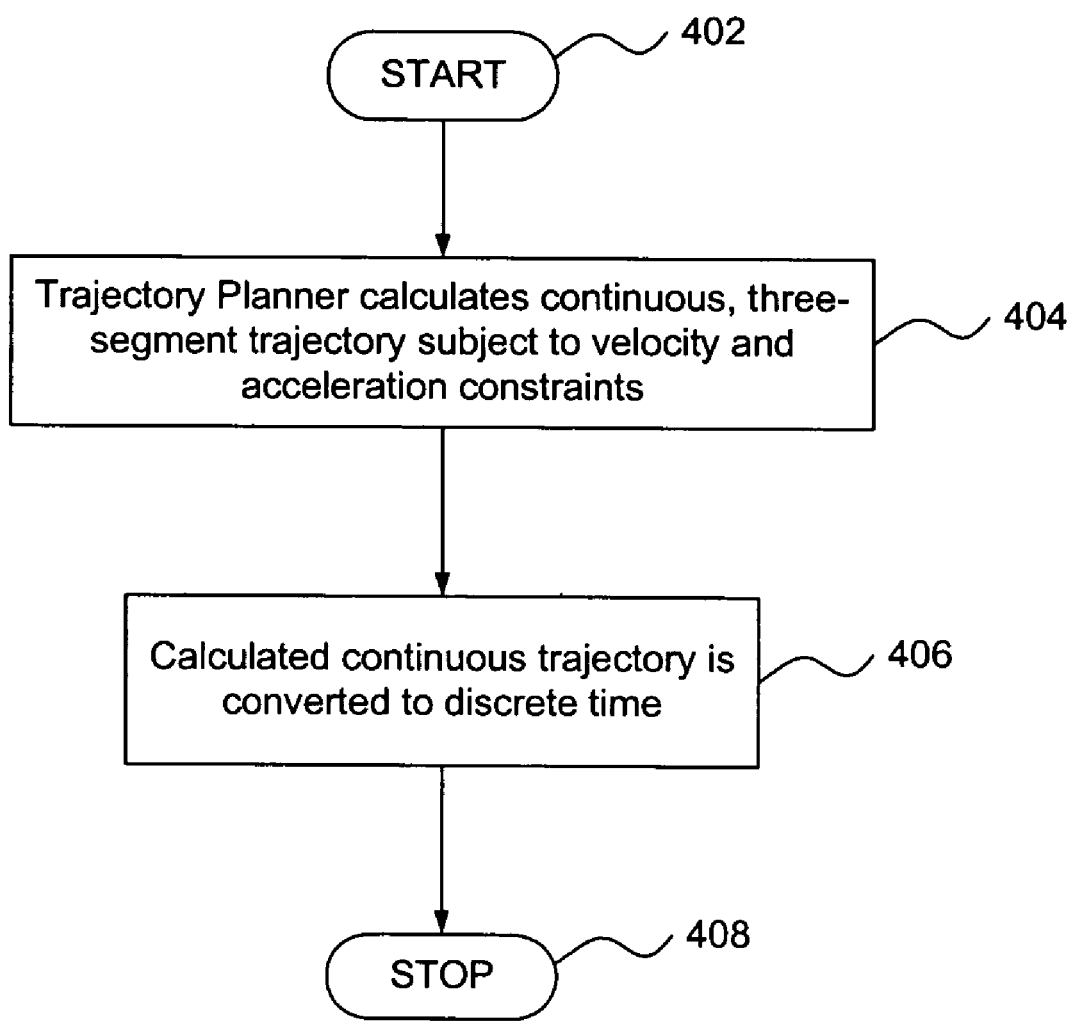
FIG. 4 is a flowchart illustrating, in general, the trajectory planning process, according to an embodiment of the invention.

FIG. 4 shows a flowchart depicting an embodiment of the operation of the trajectory planning process of the present invention. FIG. 4 shows how a trajectory is calculated, generally, by trajectory planner 130. The process begins with step 402. In step 404, a trajectory planner calculates a trajectory subject to velocity and acceleration constraints. These constraints represent physical limitations of control system 170. The calculation of step 404 is described in greater detail below. In step 406, the trajectory calculated in step 404 is quantized. This represents decomposition of the trajectory into discrete time intervals. The process concludes at step 408.

Figure 5:
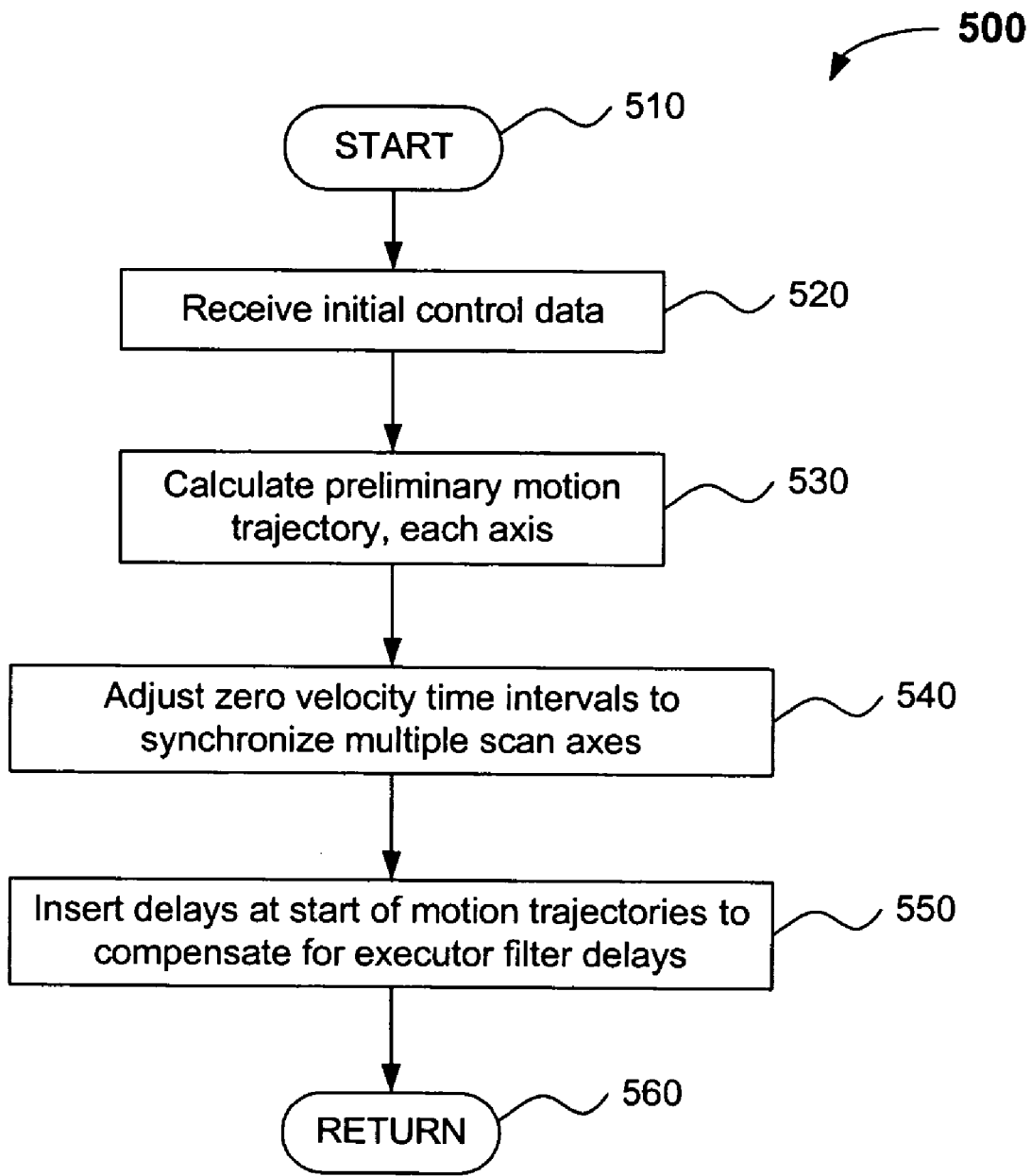
FIG. 5 is a flowchart illustrating the trajectory planning process in greater detail, according to an embodiment of the invention.

Trajectory planning is illustrated in greater detail in FIG. 5. The process begins with step 510. In step 520, the trajectory planner receives initial control data. In step 530, the preliminary trajectory of a given component of the photolithography system is calculated for each axis. At step 540, adjustments are made to the trajectory at the time intervals in which velocity is zero, so as to synchronize motion in the different scan axes. In step 550, delays are inserted at the start of motion trajectories to compensate for filter delays that may occur in the profile executor 150. The process concludes at step 560.

A. Calculation of Motion in Each Axis

Figure 6:
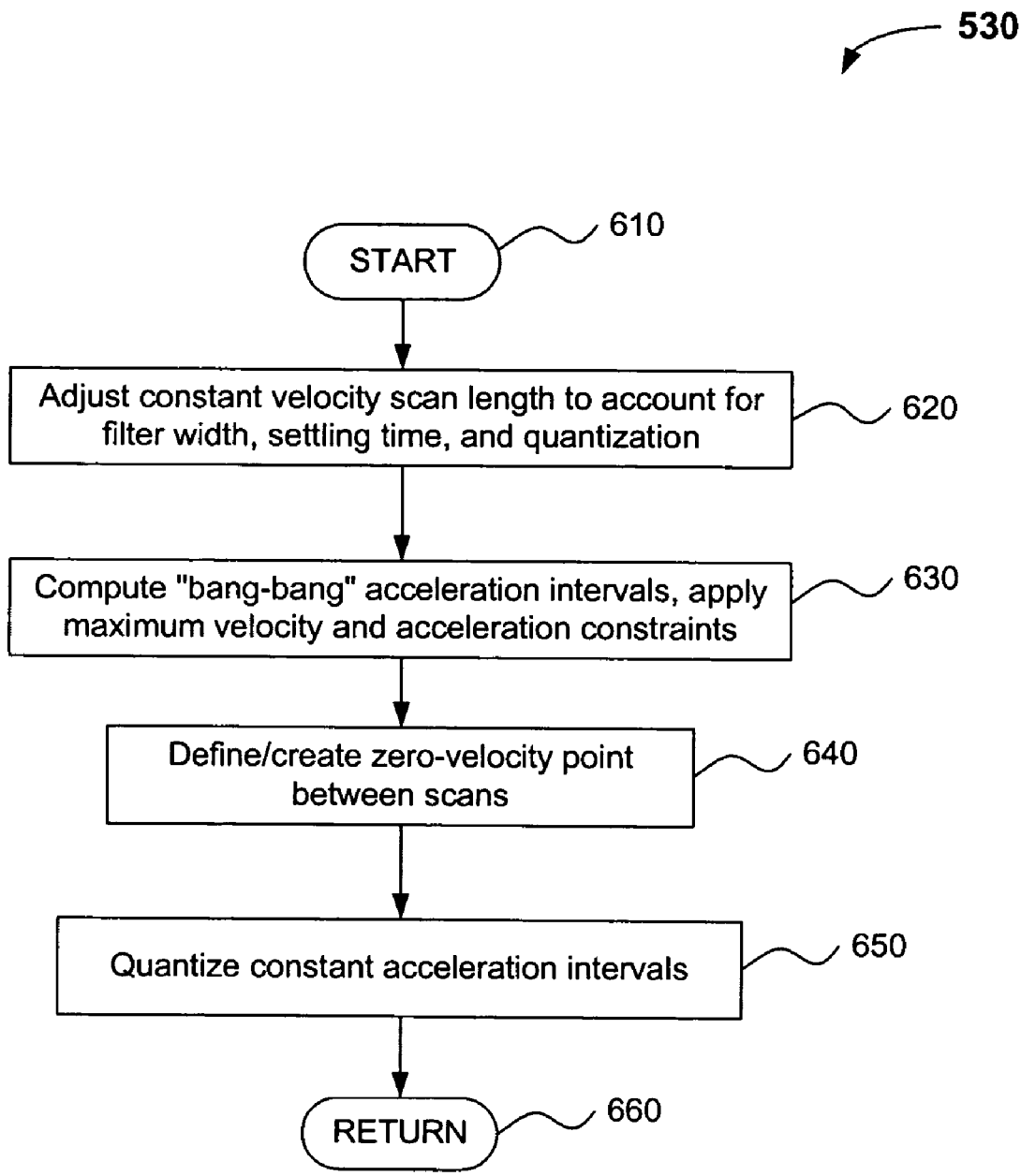
FIG. 6 is a flowchart illustrating the process of calculating the motion of a component of a photolithography system for a given axis, according to an embodiment of the invention.

The process of calculating the motion of a component of a photolighography system in each axis, step 530, is illustrated in FIG. 6. The process begins with a step 610. In step 620, the length of any constant velocity scan is adjusted to account for the width of filters in the profile executor, settling time, and quantization. Specifically, adjustment of a constant velocity scan length is performed by extending end points of the constant velocity scan. "Settling time" refers to time required for servo errors to reach an acceptable performance level. When a motion profile consists of acceleration intervals during which servo errors are not critical, followed by a time period of zero or constant velocity where servo errors must be minimized, it is often necessary to allow a time period, after the acceleration is over, for settling. This settling time allows the servo errors to reach the appropriate performance level. Step 620 will be described in greater detail below.

In step 630, acceleration intervals are calculated for moving a component from position and velocity states at the end of one scan to the position and velocity state at the beginning of the next scan. It is desirable to do this in a minimum amount of time consistent with control system constraints for maximum velocity and acceleration.

In step 640, a zero velocity point is identified, or if necessary created in the motion profile to provide a point where time can be added to the profile for the purpose of either synchronizing multiple axes, or to allow the trajectory to be easily stopped and restarted after any individual field scan.

In step 650, acceleration intervals are quantized to produce a series of discrete acceleration intervals. Here, constant velocity time intervals are rounded to an integer number of clock periods, and new acceleration values are calculated to produce the same net motion that would have resulted if the non-integer acceleration periods had been used. This quantization procedure must comply with constraints for maximum velocity and acceleration, and, as a result, the total quantized time intervals may be longer, but never shorter than the ideal, non-quantized intervals. The motion calculation process concludes at step 660.

Figure 7:
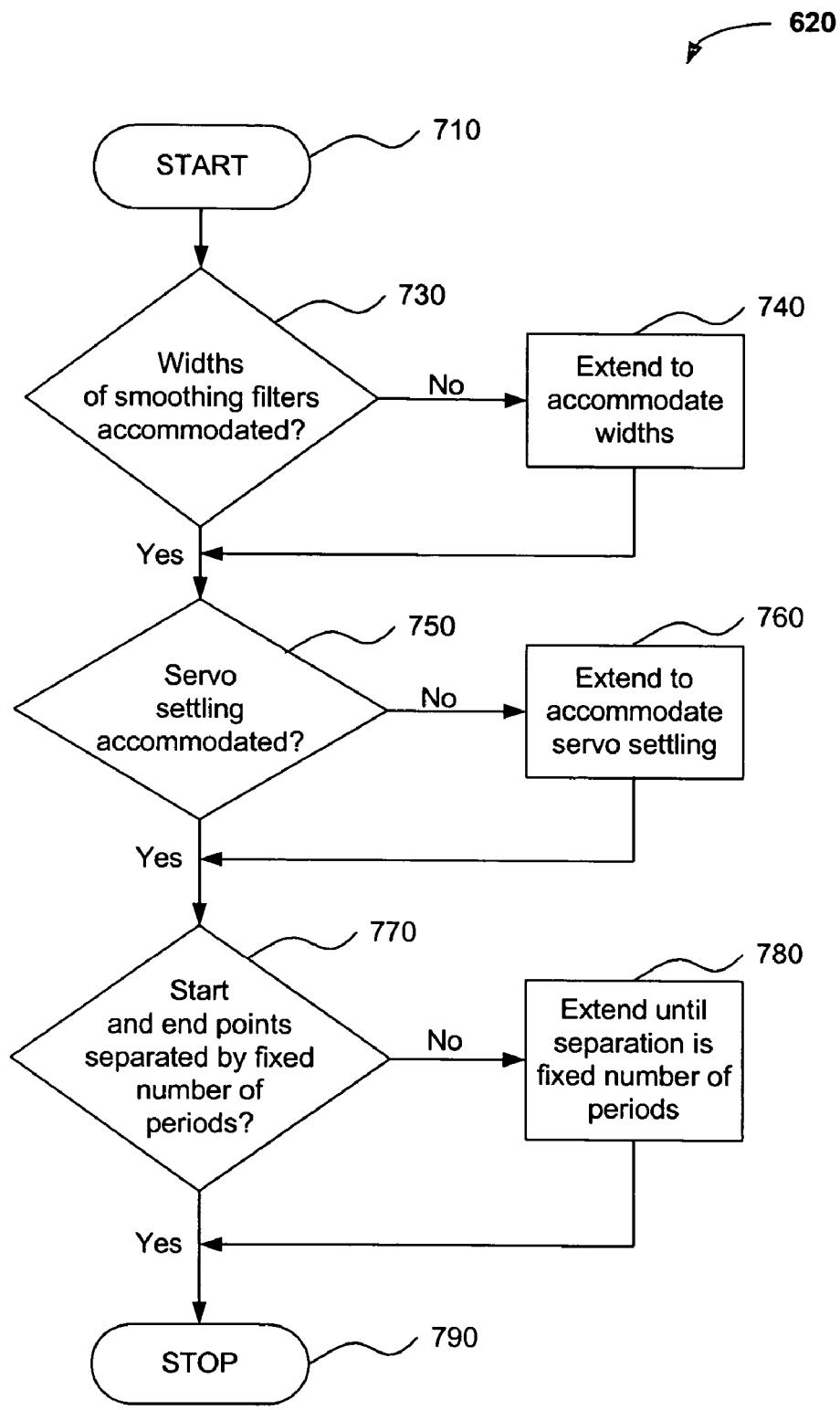
FIG. 7 is a flowchart illustrating the process of adjusting a constant velocity scan length, according to an embodiment of the invention.

Step 620 above, the adjustment of constant velocity scan length, is illustrated in greater detail in FIG. 7. The process begins at step 710. At this point, the start and end points of a constant velocity scan, as provided in the initial control data, have been received. In step 730, a determination is made as to whether the respective widths of all filters in the profile executor are accommodated. If not, in step 740 the length of the constant velocity scan is extended to accommodate the widths of the filters. Not fully accommodating the filters is an option that will result in part of the exposure scan not being at constant velocity. If both reticle and wafer filters are matched then synchronization of the stages during exposure can still be maintained. A varying exposure velocity will require a dynamic correction of exposing power to maintain dose uniformity. In step 750, a determination is made as to whether servo settling is accommodated. If not, in step 760, the end points of the scan lengths are extended to accommodate servo settling. In step 770, a determination is made as to whether the start and end points are separated by a fixed number of periods. If not, the process continues at step 780. At this step, start and end points are moved, i.e. scan lengths are extended, until separation between the points is a fixed number of periods. In step 790, the process concludes.

Figure 8:
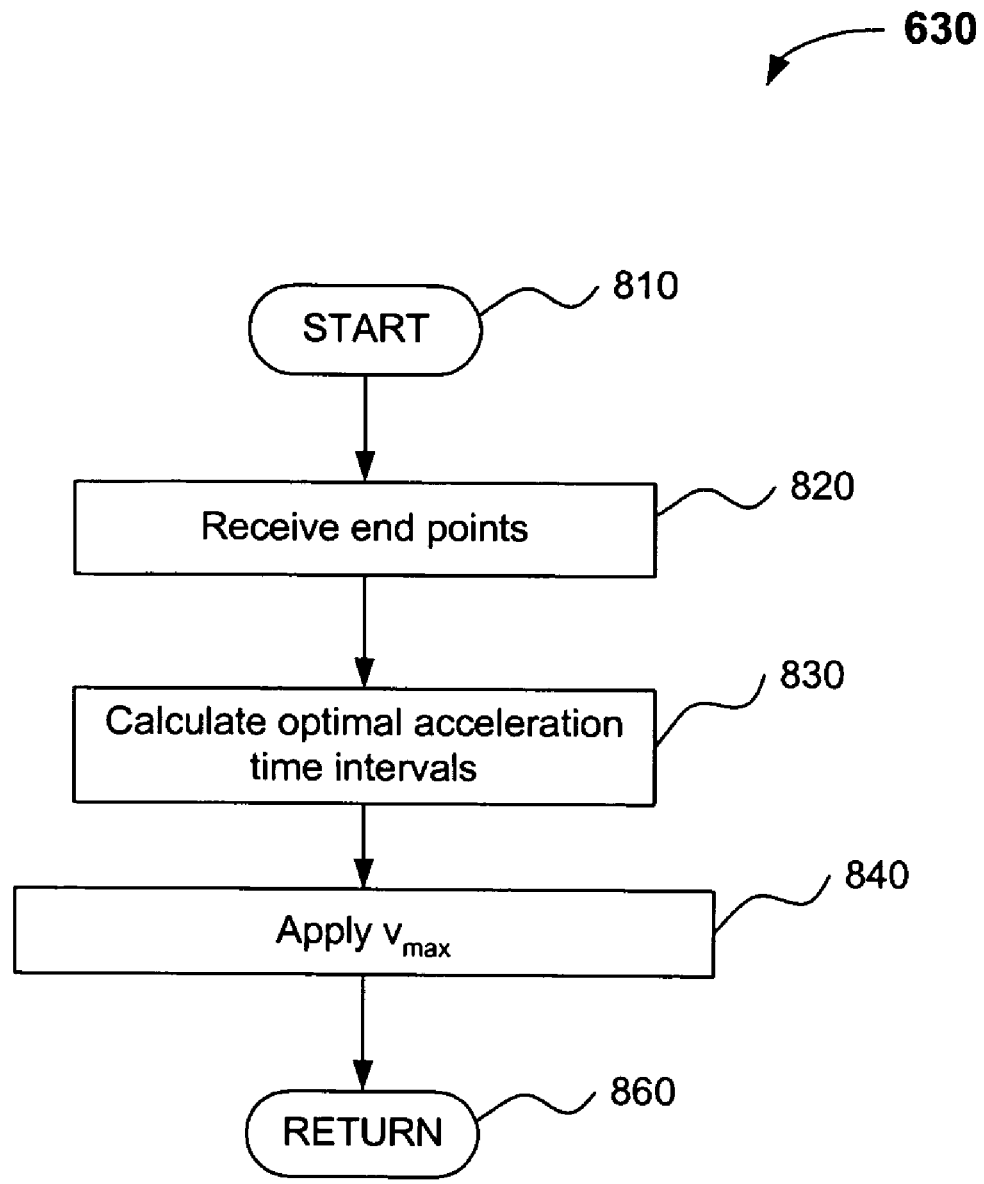
FIG. 8 is a flowchart illustrating the process of calculating an acceleration interval, taking into account maximum velocity and acceleration constraints, according to an embodiment of the invention.

Step 630, the computation of acceleration intervals, is illustrated in greater detail in FIG. 8. The process begins with step 810. In step 820, the end points of the scans, as adjusted in step 620, are received. In step 830, optimum intervals of maximum acceleration are calculated to allow a component to move from the position and velocity state at the end of one scan to the position and velocity state at the beginning of the next scan. A maximum velocity constraint is not yet applied. Step 830 is illustrated in greater detail in FIGS. 9 and 10 below.

Figure 11:
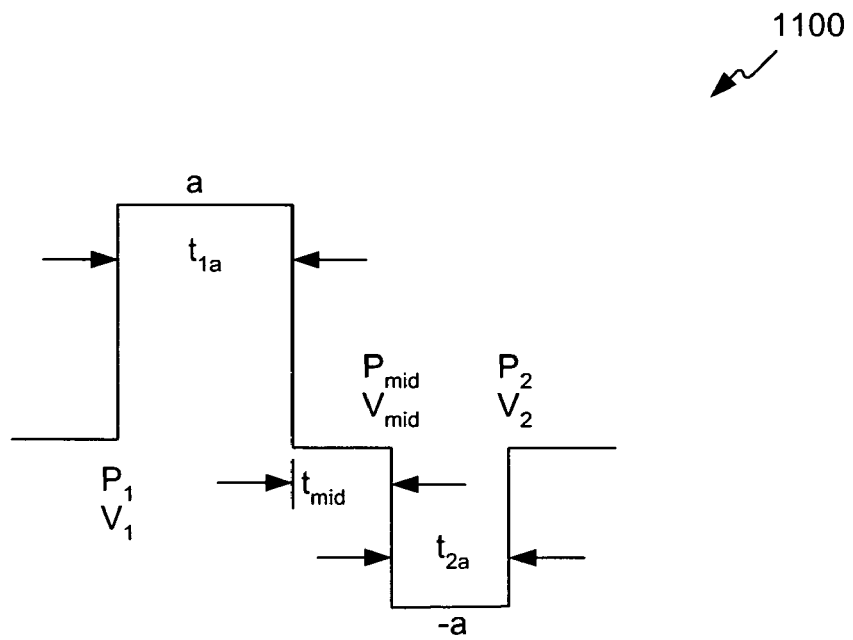
FIG. 11 illustrates a profile that contains three acceleration intervals and having a maximum velocity constraint.
Figure 12:
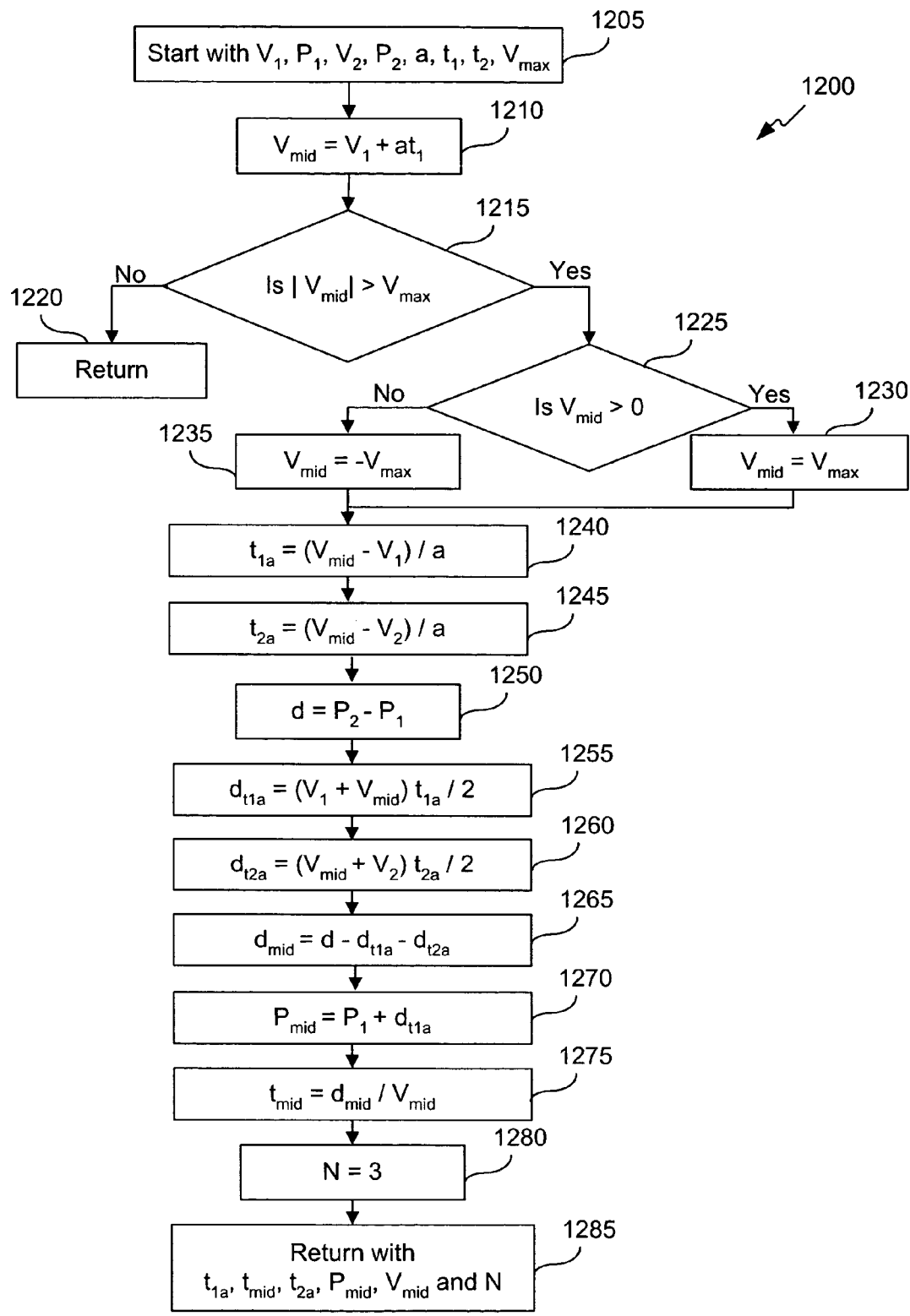
FIG. 12 is a flowchart illustrating the process of calculating acceleration intervals in the case where there is a maximum velocity constraint, according to an embodiment of the invention.

In step 840, the two-state profile is modified into a three-state profile that is consistent with a maximum velocity ($v_{max}$) constraint. FIGS. 11 and 12 illustrate this process, and will be detailed below. In the event the velocity exceeds the maximum value feasible for the control system, a zero acceleration interval is added between the two maximum acceleration intervals, and the lengths of the maximum acceleration intervals are modified to maintain the same start and end points. The process concludes at step 860.

Figure 9:
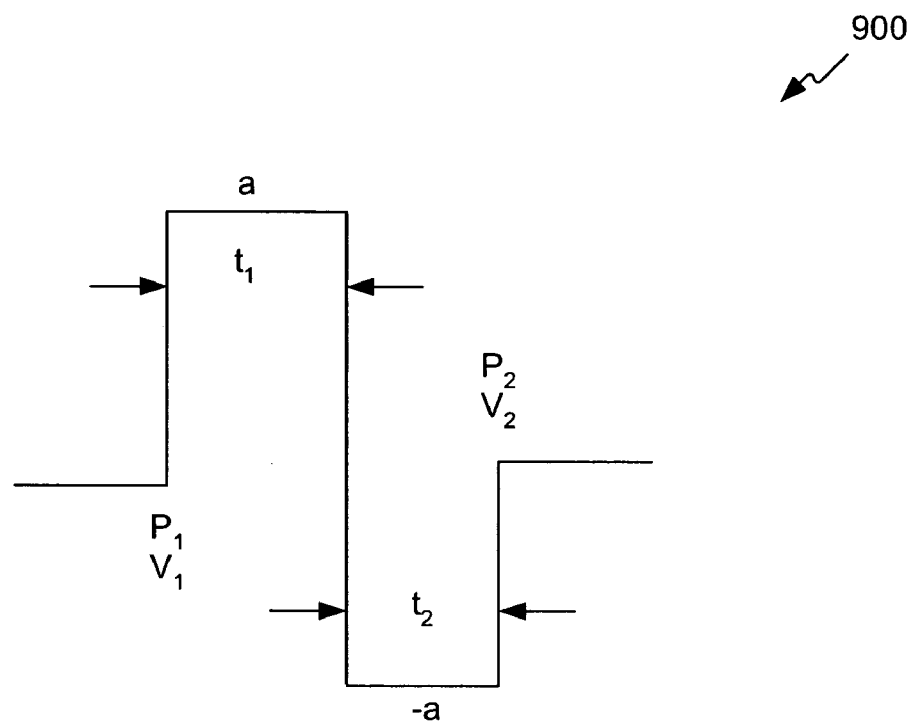
FIG. 9 illustrates a profile that contains two acceleration intervals and has no maximum velocity constraint.
Figure 10:
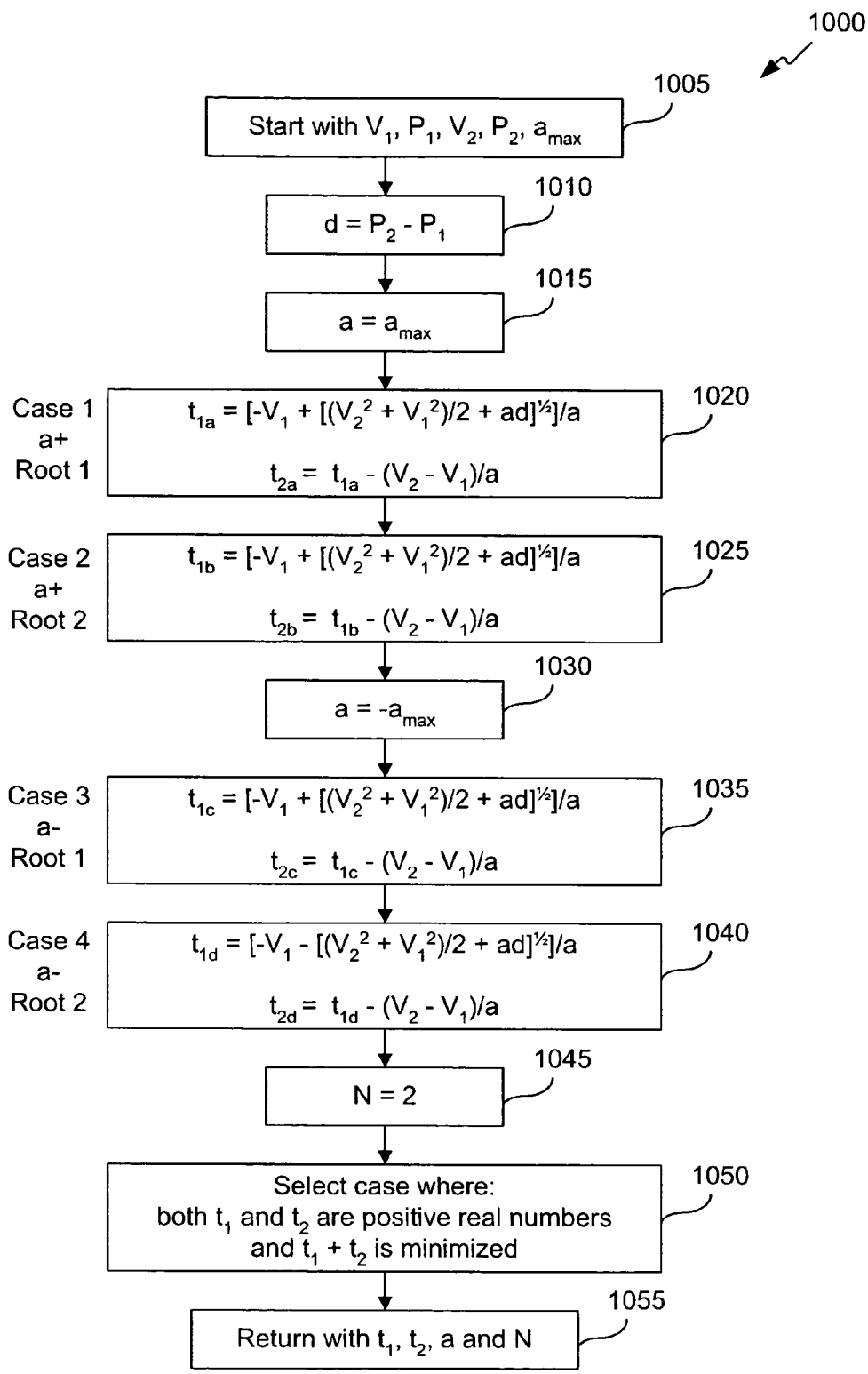
FIG. 10 is a flowchart illustrating the process of calculating acceleration intervals in the case where there is no maximum velocity constraint, according to an embodiment of the invention.

An embodiment of step 830 is illustrated in greater detail in FIGS. 9 and 10. FIG. 9 shows a "bang-bang" profile with two constant acceleration intervals that are consistent with a maximum acceleration ($a_{max}$) constraint. Graph 900 shows acceleration versus time. Initially, acceleration is zero, while position and velocity are given by $P_1$ and $V_1$ respectively. Motion is then accelerated to a level denoted with the variable a. Acceleration a continues for a duration $t_1$, before changing to acceleration –a. Acceleration –a continues for a duration $t_2$. Finally, acceleration returns to zero, at which point position and velocity are given by $P_2$ and $V_2$ respectively.

FIG. 10 is a flowchart illustrating the process of calculating an acceleration time interval without a maximum velocity constraint, according to an embodiment of the invention. The process starts with step 1005, in which $V_1, P_1, V_2, P_2$, and $a_{max}$ are input. In step 1010, the total displacement d is calculated, d=P$_2$–P$_1$. In step 1015, an acceleration variable a is set to a$_{max}$.

In step 1020, the quadratic equation is applied to determine one of the two possible solutions for t$_1$, shown here as t$_{1a}$. The calculation is as follows:

$$t_{1a} = \frac{-V_1 + [(V_2^2 + V_1^2)/2 + ad]^{1/2}}{a}$$

The corresponding value for t$_2$, shown in step 1020 as t$_{2a}$, is calculated on the basis of t$_{1a}$:

$$t_{2a} = t_{1a} - \frac{(V_2 - V_1)}{a}$$

In step 1025, the second solution for t$_1$ is calculated, identified as t$_{1b}$:

$$t_{1b} = \frac{-V_1 - [(V_2^2 + V_1^2)/2 + ad]^{1/2}}{a}$$

The corresponding value for t$_2$, shown here as t$_{2b}$, is calculated on the basis of t$_{1b}$:

$$t_{2b} = t_{1b} - \frac{(V_2 - V_1)}{a}$$

In step 1030, the variable a is set to –a$_{max}$. As in step 1020, the quadratic equation is applied in step 1035 to determine one of the two possible solutions for t$_1$, shown here as t$_{1c}$. The calculation is as follows:

$$t_{1c} = \frac{-V_1 + [(V_2^2 + V_1^2)/2 + ad]^{1/2}}{a}$$

The corresponding value for t$_2$, shown here as t$_{2c}$, is calculated on the basis of t$_{1c}$:

$$t_{2c} = t_{1c} - \frac{(V_2 - V_1)}{a}$$

In step 1040, the second solution is calculated, t$_{1d}$:

$$t_{1d} = \frac{-V_1 - [(V_2^2 + V_1^2)/2 + ad]^{1/2}}{a}$$

The corresponding value for t$_2$, shown here as t$_{2d}$, is calculated on the basis of t$_{1d}$:

$$t_{2d} = t_{1d} - \frac{(V_2 - V_1)}{a}$$

In step 1045, the number of acceleration states (N) is set to 2. In step 1050, one of the above t$_1$ values is chosen, along with its corresponding t$_2$ value. The selection is performed such that both t$_1$ and t$_2$ are positive real numbers, and the sum t$_1$+t$_2$ is minimized. In step 1055, t$_1$, t$_2$, a, and N are returned.

An embodiment of step 840, the application of velocity constraint V$_{max}$ to the computation of an acceleration interval, is illustrated in greater detail in FIGS. 11 and 12. Graph 1100 of FIG. 11 shows how acceleration changes over time, given a maximum velocity constraint. Initially, acceleration is zero, and position and velocity are given by P$_1$ and V$_1$ respectively. Acceleration then begins, quantified as acceleration a, and lasts for a duration t$_{1a}$. Acceleration then returns to zero for a duration t$_{mid}$, after which position and velocity are given by P$_{mid}$ and V$_{mid}$ respectively. Another acceleration interval then occurs, where the acceleration has a value –a, for duration t$_{2a}$. After t$_{2a}$, the position and velocity are given by P$_2$ and V$_2$ respectively.

FIG. 12 illustrates the calculation of acceleration intervals given a constraint V$_{max}$, according to an embodiment of the invention. The process begins with step 1205, in which values for P$_1$, V$_1$, P$_2$, V$_2$, a, t$_1$, t$_2$, and V$_{max}$ are input. In step 1210, V$_{mid}$ is calculated to be V$_1$+at$_1$. In step 1215, a determination is made as to whether the absolute value of V$_{mid}$ exceeds V$_{max}$. If not, then the velocity constraint is not violated, and the process concludes at step 1220. If V$_{mid}$ exceeds V$_{max}$, then in step 1225 a determination is made as to whether V$_{mid}$ exceeds zero. If so, then V$_{mid}$ is set to V$_{max}$ in step 1230. Otherwise, V$_{mid}$ is set to –V$_{max}$ in step 1235.

In step 1240, t$_{1a}$ is calculated, $$t_{1a} = \frac{(V_{mid} - V_1)}{a}$$

In step 1245, t$_{2a}$ is calculated, $$t_{2a} = \frac{(V_{mid} - V_2)}{a}$$

In step 1250, the displacement d between positions P$_1$ and P$_2$ is calculated. In step 1255, the distance traveled during t$_{1a}$ is calculated, $$d_{t1a} = \frac{(V_1 + V_{mid})t_{1a}}{2}$$

In step 1260, the distance traveled during t$_{2a}$ is calculated, $$d_{t2a} = \frac{(V_{mid} + V_2)t_{2a}}{2}$$

In step 1265, the distance traveled during t$_{mid}$ is calculated, $$d_{mid} = d - d_{t1a} - d_{t2a}$$

In step 1270, P$_{mid}$ is calculated, $$P_{mid} = P_1 + d_{t1a}$$

In step 1275, the duration $t_{mid}$ is calculated, $$t_{mid} = \frac{d_{mid}}{V_{mid}}$$

In step 1280, the number of acceleration intervals N is set to three. The process concludes at step 1285 with the return of $t_{1a}$, $t_{mid}$, $t_{2a}$, $P_{mid}$, and N.

Figure 13:
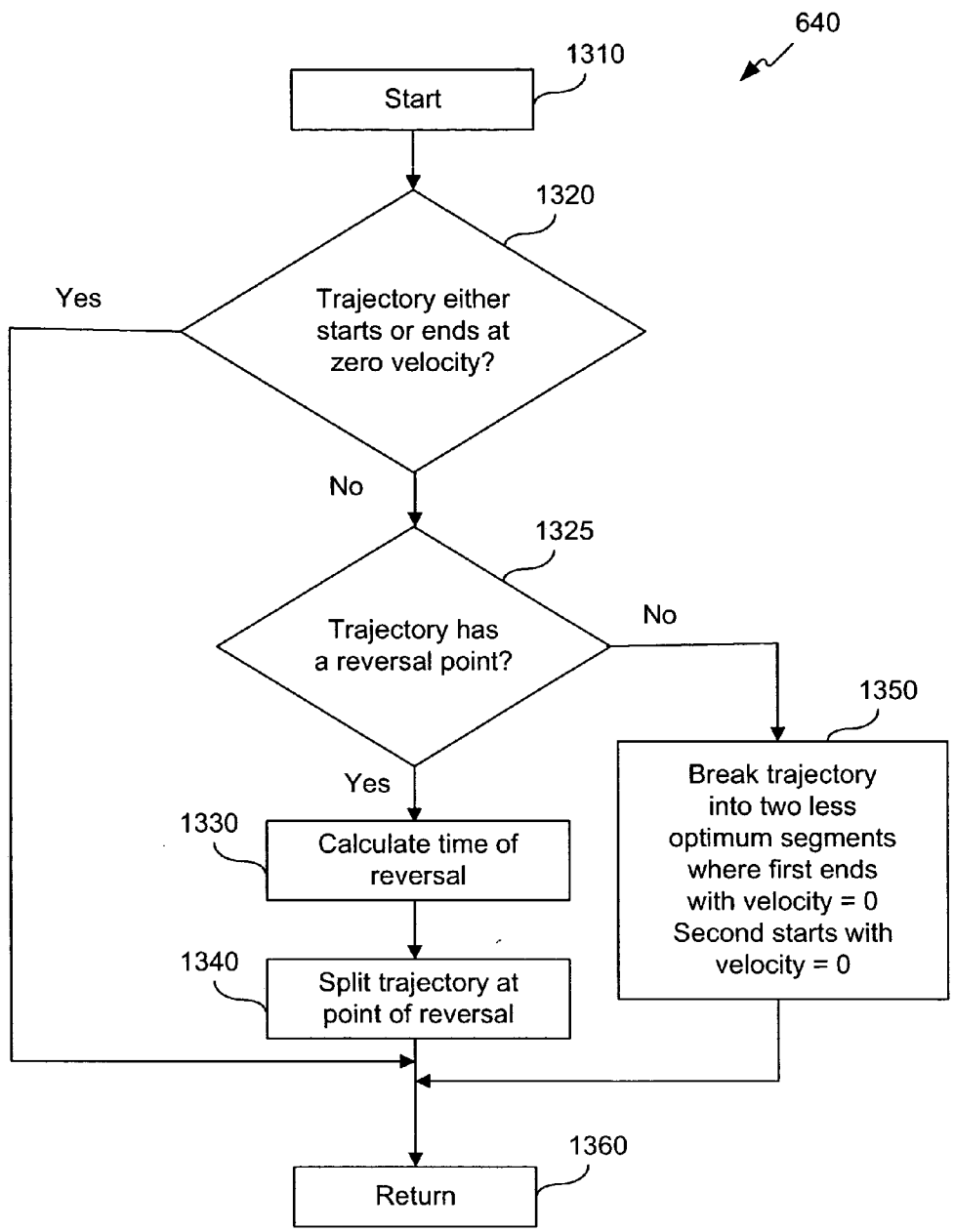
FIG. 13 is a flowchart illustrating the process of creating a zero velocity point between scans, according to an embodiment of the invention.

Step 640, the step of defining zero velocity points between scans, is illustrated in greater detail in FIG. 13. The process begins at step 1310. In step 1320, a determination is made as to whether the trajectory linking the end of one scan with the start of another scan starts or ends with zero velocity. If so, the process concludes at step 1360. If not, the process continues to step 1325, where a determination is made as to whether this trajectory has a reversal point. If so, then processing continues at step 1330. Here, the time of reversal is calculated. In step 1340, this trajectory is split into two segments at the reversal point (at which velocity is zero). Alternatively, if the trajectory has no reversal point, then the process continues at step 1350. Here, the trajectory is broken into two less optimal segments, wherein the first ends with velocity equal to zero, and the second starts with velocity equal to zero. The process concludes at step 1360.

B. Adjusting Zero Velocity Time Intervals to Synchronize Multiple Scan Axes

Figure 14:
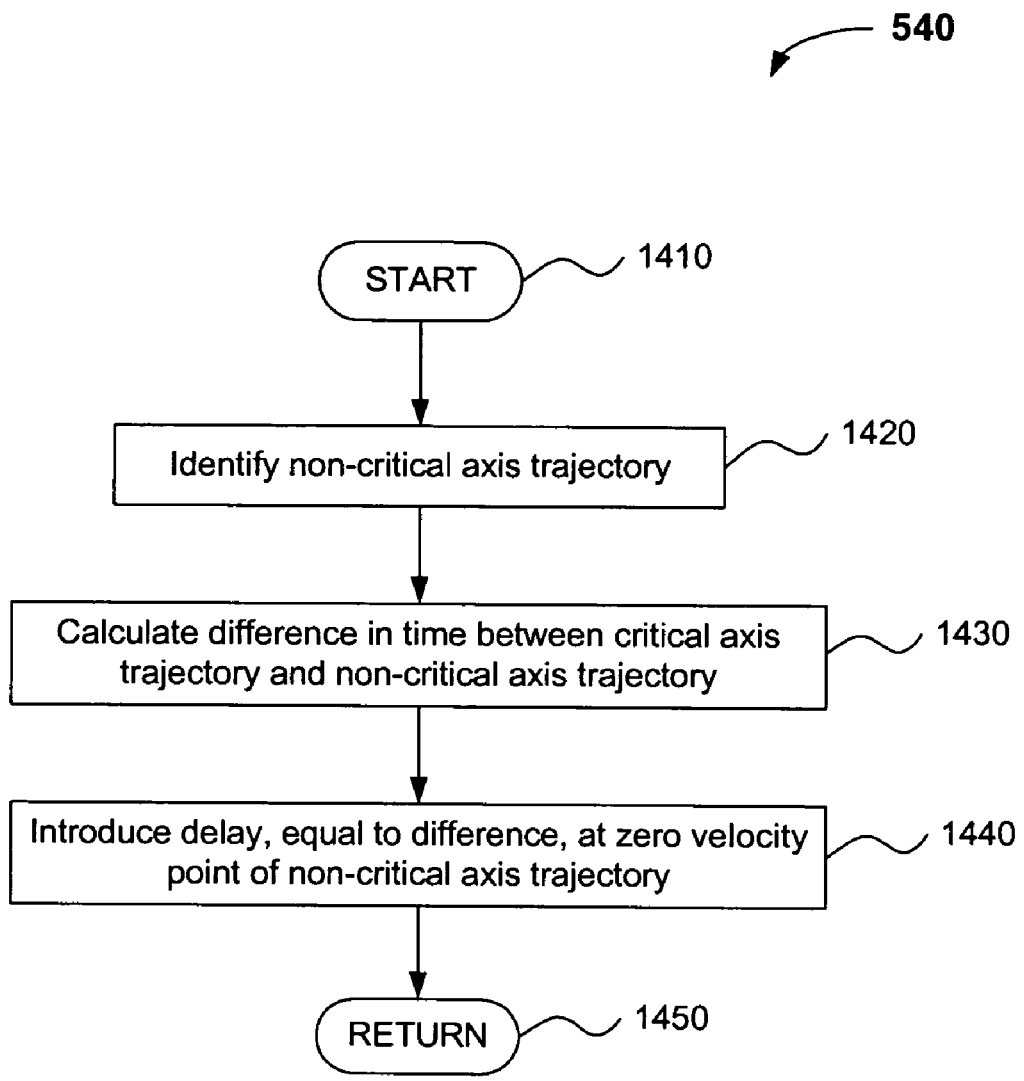
FIG. 14 is a flowchart illustrating the process of adjusting zero velocity time intervals to synchronize multiple scan axes, according to an embodiment of the invention.

Step 540, the step of adjusting zero velocity time intervals to synchronize multiple axes, is described in greater detail in FIG. 14. At this point in the trajectory planning process, all the required motion trajectories have been reduced to quantized intervals of constant acceleration, and furthermore there are defined zero velocity points between all synchronized portions of the trajectories. Using integer arithmetic, additional time can be inserted during the non-synchronized portions of the motion trajectories, at these zero velocity points. This allows the axes with shorter trajectory durations (i.e., non-critical paths) to be delayed to take the same time as the longest (i.e., critical) path axis. This causes the scanning motions to be precisely synchronized, with no loss in throughput. The process for each non-critical axis trajectory begins with step 1410. In step 1420, a non-critical axis trajectory is identified. In step 1430, the difference in time between the critical axis trajectory and the non-critical axis trajectory is calculated. In step 1440, a delay is introduced, wherein the delay is equal to the difference, calculated in step 1430, at the zero velocity point of the non-critical axis trajectory. The process concludes at step 1450.

Note that in alternative embodiments of the invention, the magnitude of the acceleration of an axis having a shorter trajectory duration can be reduced. Such reduction in acceleration can also be used in synchronizing multiple scan axes.

C. Compensation For Executor Filter Delays

Figure 15:
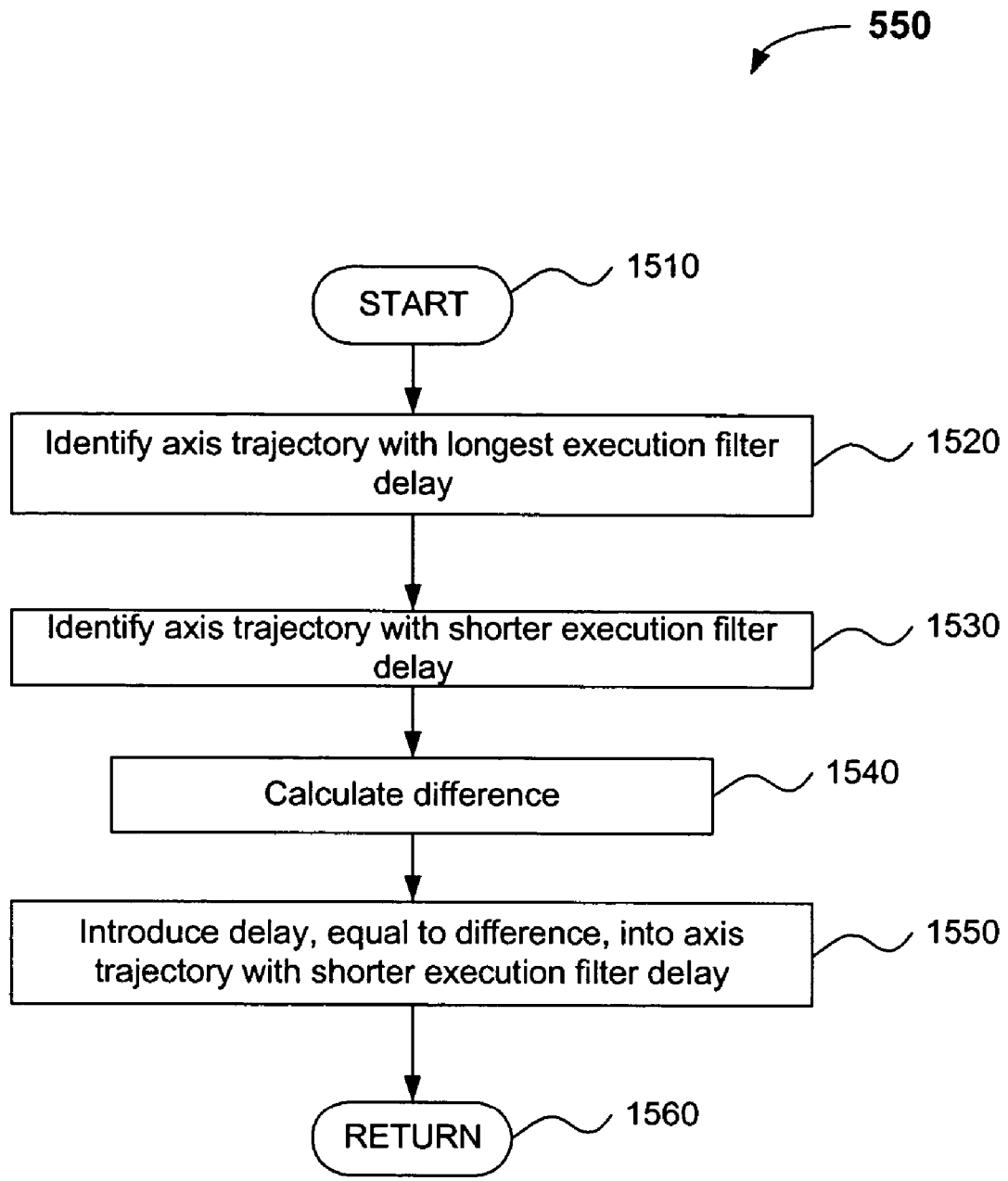
FIG. 15 is a flowchart illustrating the process of creating a delay at the start of a motion trajectory, to compensate for filter delays, according to an embodiment of the invention.

In an embodiment of the invention, an additional step in the planning process is to account for any delays that may be introduced by the filtering used in the profile executor. In general, any time a new motion trajectory is started, axes with shorter filter delays can be intentionally delayed by an integer number of clock periods. This allows synchronization of the multi-axis motion profiles produced by the profile executor. This process of compensating for filter delays is illustrated in greater detail in FIG. 15 and corresponds to step 550 of FIG. 5. The process begins with step 1510. In step 1520, the axis trajectory having the longest execution filter delay is identified. In step 1530, an axis trajectory having a shorter execution filter delay is identified. In step 1540, the difference between the delays is calculated. In step 1550, a delay, equal to this difference, is introduced into the axis trajectory with the shorter execution filter delay. The process concludes at step 1560.

II. Profile Execution

The profile executor integrates the output of the trajectory planner into an infinite jerk position profile, and then uses filters to optimize the shapes of the position profiles. In an embodiment of the invention, finite impulse response (FIR) filters are used. Alternatively, infinite impulse response (IIR) filters are used. Separate, independently-tuned filters can be used to optimize the shape of acceleration commands. The filters used to smooth the infinite jerk position profiles must have matched group delays on all axes, unless the trajectory planner process accounts for the differences. Much of the executor process can be executed at a relatively slow clock rate, and then up-sampled to a higher clock rate using an interpolating algorithm. The outputs of the profile executor are then fed to the control system. An implementation of a system and method for profile execution is described below and in U.S. patent application Ser. No. 09/757,622, "Method and System for Efficient and Accurate Filtering and Interpolation," filed Jan. 11, 2001, and incorporated herein by reference in its entirety.

Figure 16:
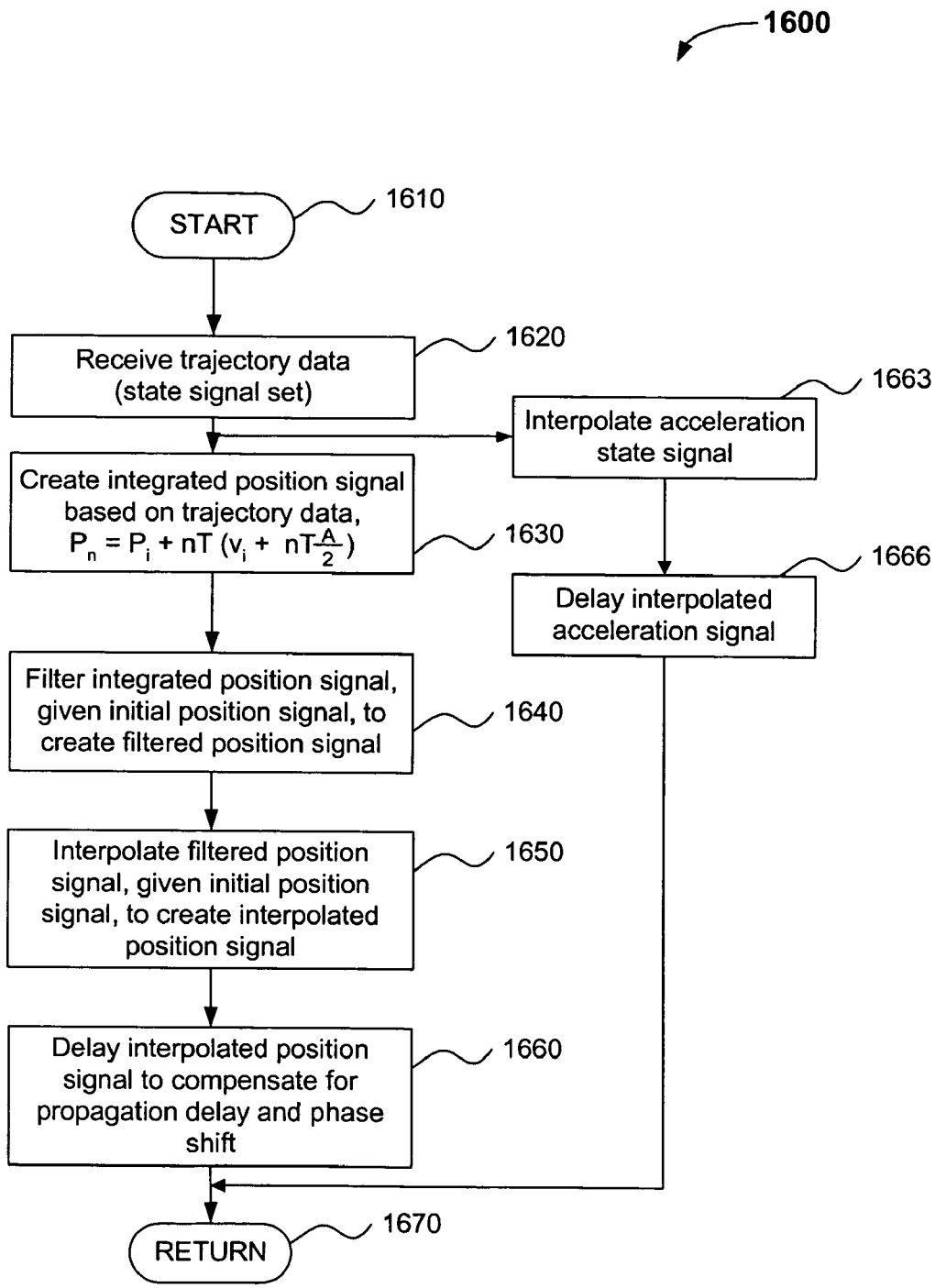
FIG. 16 is a flowchart illustrating the process of profile execution, according to an embodiment of the invention.

An embodiment of the profile execution process is illustrated in FIG. 16. The process begins with step 1610. In step 1620, trajectory data is received from the trajectory planner. As described above, the trajectory data can be viewed as a set of state signals. In step 1630, an integrated position signal is created, based on the trajectory data. The position $P_n$ at the time interval n is given by the equation $$P_n = P_i + nT(v_i + nTA/2),$$

where
$P_i$ is the initial position provided by signal 210,
n is the sample time,
T is the clock period,
$V_i$ is the initial velocity given by signal 212, and
A is the acceleration, as given by signal 214.

In step 1640, the integrated position signal is filtered, given an initial position signal, to create a filtered position signal. This step is described in greater detail below. In step 1650, the filtered position signal is interpolated, to create an interpolated signal, given an initial position signal. This step is likewise described in greater detail below. In step 1660, the interpolated signal is delayed to compensate for propagation delay and phase shift. The process concludes at step 1670.

Figure 17:
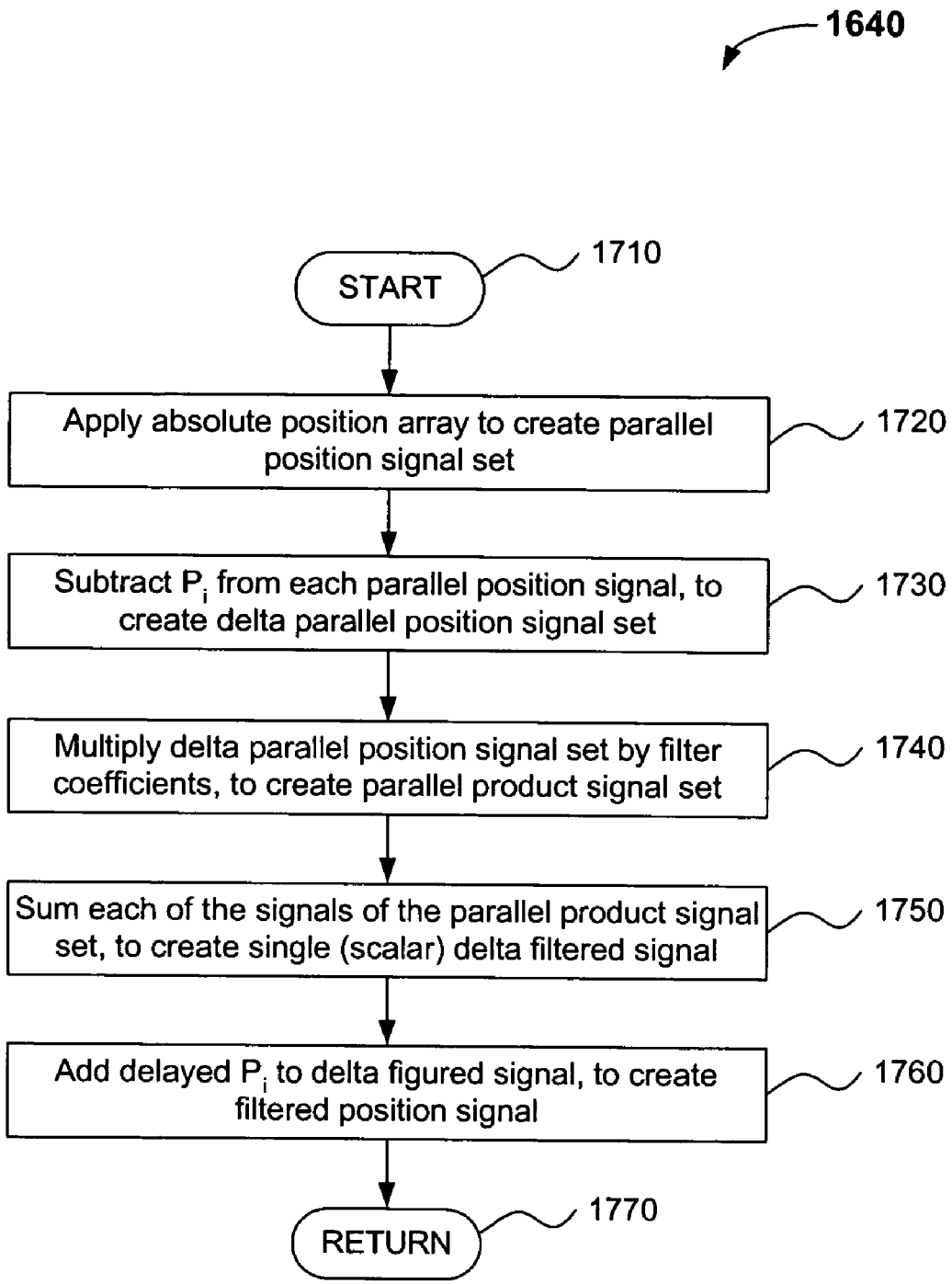
FIG. 17 is a flowchart illustrating the process of filtering an integrated position signal, according to an embodiment of the invention.

Step 1640, the filtering of an integrated position signal, is described in greater detail in FIG. 17. The process begins at step 1710. In step 1720, an absolute position array is applied to the integrated position signal, to create a parallel position signal set. In step 1730, the initial position, $P_i$, is subtracted from each parallel position signal of the created parallel position signal set. This creates a delta parallel position signal set. In step 1740, the delta parallel position signal set is multiplied by filter coefficients, to create a parallel product signal set. In step 1750, each of the signals of the parallel product signal set is summed to create a single scalar delta filtered signal. In step 1760, a delayed initial position signal $T_i$ is added to the delta filtered signal, to create the filtered position signal. The process concludes at step 1770.

Figure 18:
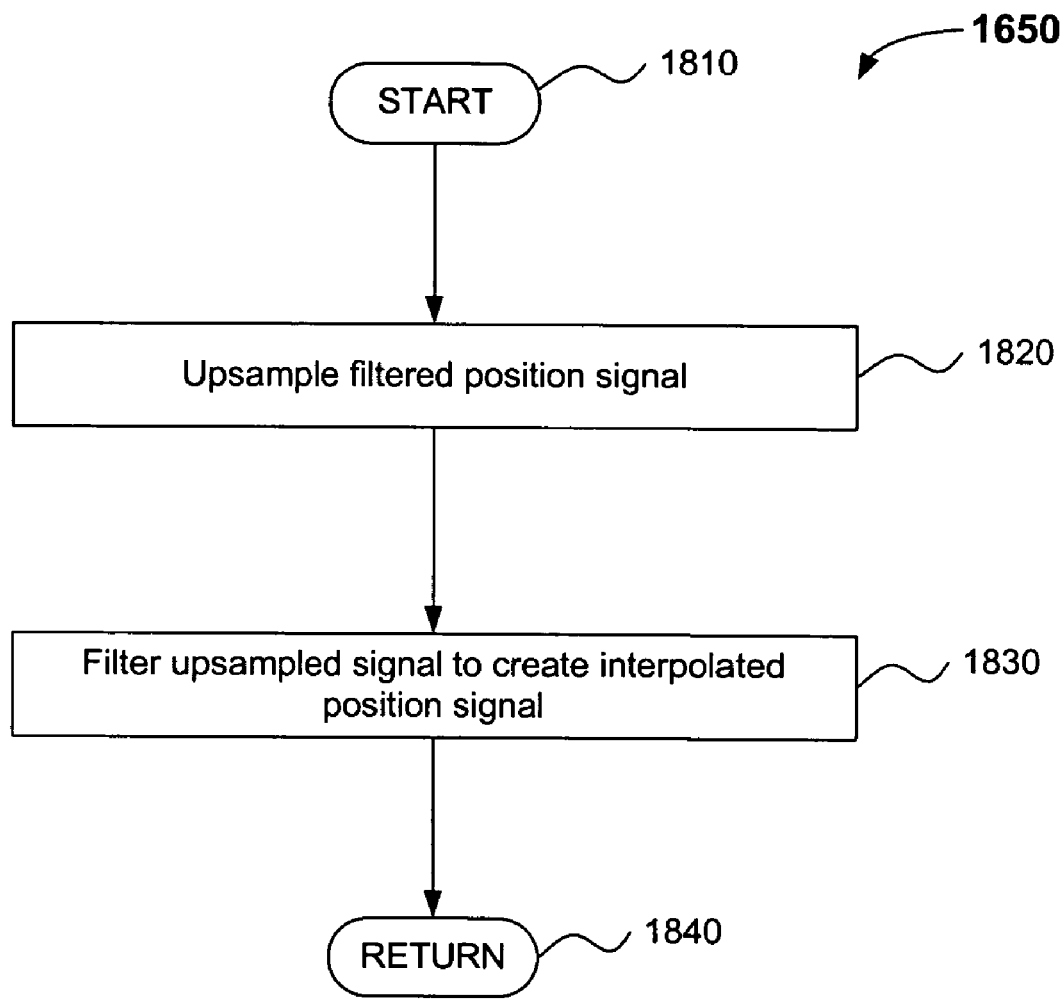
FIG. 18 is a flowchart illustrating the process of interpolating a filtered position signal, according to an embodiment of the invention.

Step 1650, the interpolation of a filtered position signal, is illustrated in greater detail in FIG. 18. The process begins at step 1810. In step 1820, the filtered position signal is upsampled. In step 1830, the upsampled signal is filtered to create the interpolated signal.

In parallel with steps 1630 through 1660, acceleration state signal 214 is interpolated separately. This takes place in step 1663. In this step, acceleration state signal 214 is first up sampled at an interpolation rate L. The unsampled acceleration signal is then filtered. Filtering prevents high frequency resonance components from being introduced by the upsampling process. The resulting interpolated acceleration signal is then delayed in step 1666. The delay represents adjustment of the interpolated acceleration signal to address propagation delay and phase alignment. The process concludes at step 1670.

Figure 19:
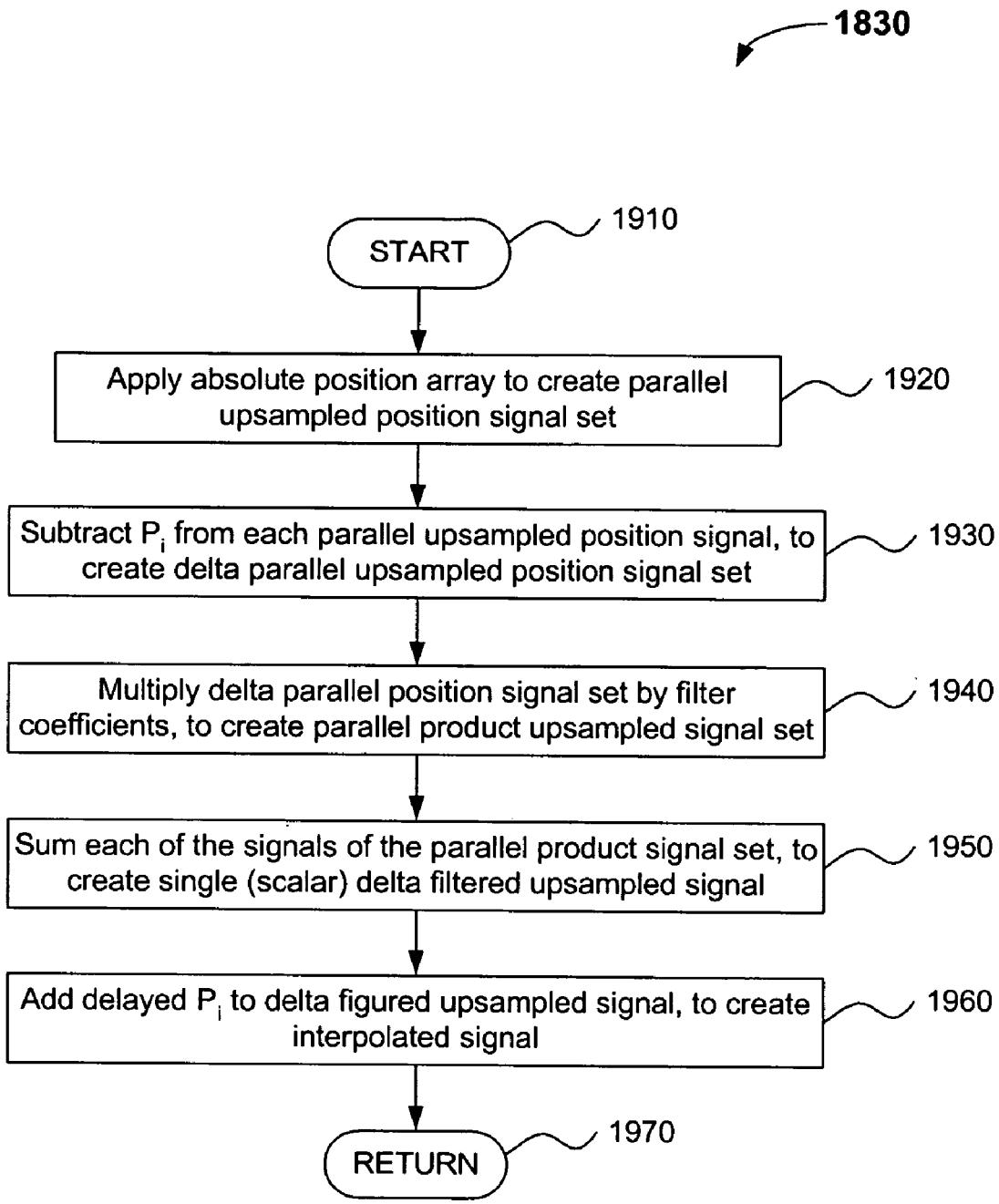
FIG. 19 is a flowchart illustrating the process of filtering an up-sampled signal to create an interpolated signal, according to an embodiment of the invention.

Step 1830 above, the filtering of an up-sampled signal, is illustrated in greater detail in FIG. 19. The process begins at step 1910. In step 1920, an absolute position array is applied to the up-sampled signal to create a parallel up-sampled position signal set. In step 1930, the initial position signal, $P_i$, is subtracted from each parallel up-sampled position signal, to create a delta parallel up-sampled position signal set. In step 1940, the delta parallel position signal set is multiplied by filter coefficients, to create a parallel product up-sampled signal set. In step 1950, each of the signals of the parallel product signal set is summed, to create a single scalar delta filtered up-sampled signal. In step 1960, the delayed initial position signal, $P_i$, is added to the delta filtered up-sampled signal, to create an interpolated signal. The process concludes at step 1970.

Figure 20:
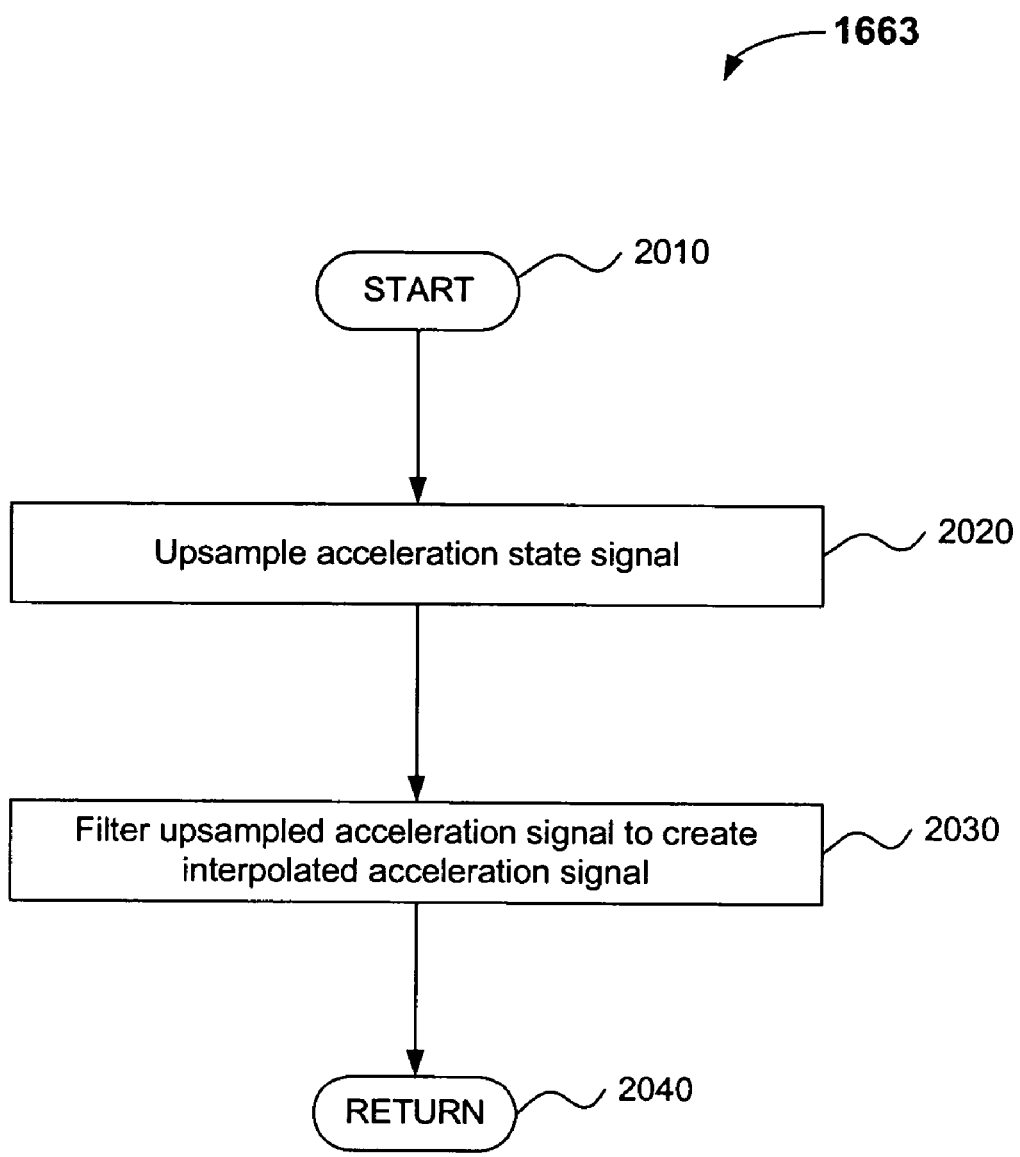
FIG. 20 is a flowchart illustrating the process of interpolating an acceleration state signal, according to an embodiment of the invention.

Step 1663 of FIG. 16, the step of interpolating the acceleration state signal, is described in greater detail in FIG. 20. The process begins with step 2010. In step 2020, the acceleration state signal is upsampled. In step 2030, the upsampled signal is filtered to create an interpolated acceleration signal. The process concludes at step 2040.

Profile executor 150 can be implemented as a computer program product that is executed by a computer. For example, the logic described above can be executed on a fixed precision arithmetic micro-controller, such as a SHARC® ADSP-21062 produced by Analog Devices, Inc. of Norwood, Mass.

Figure 21:
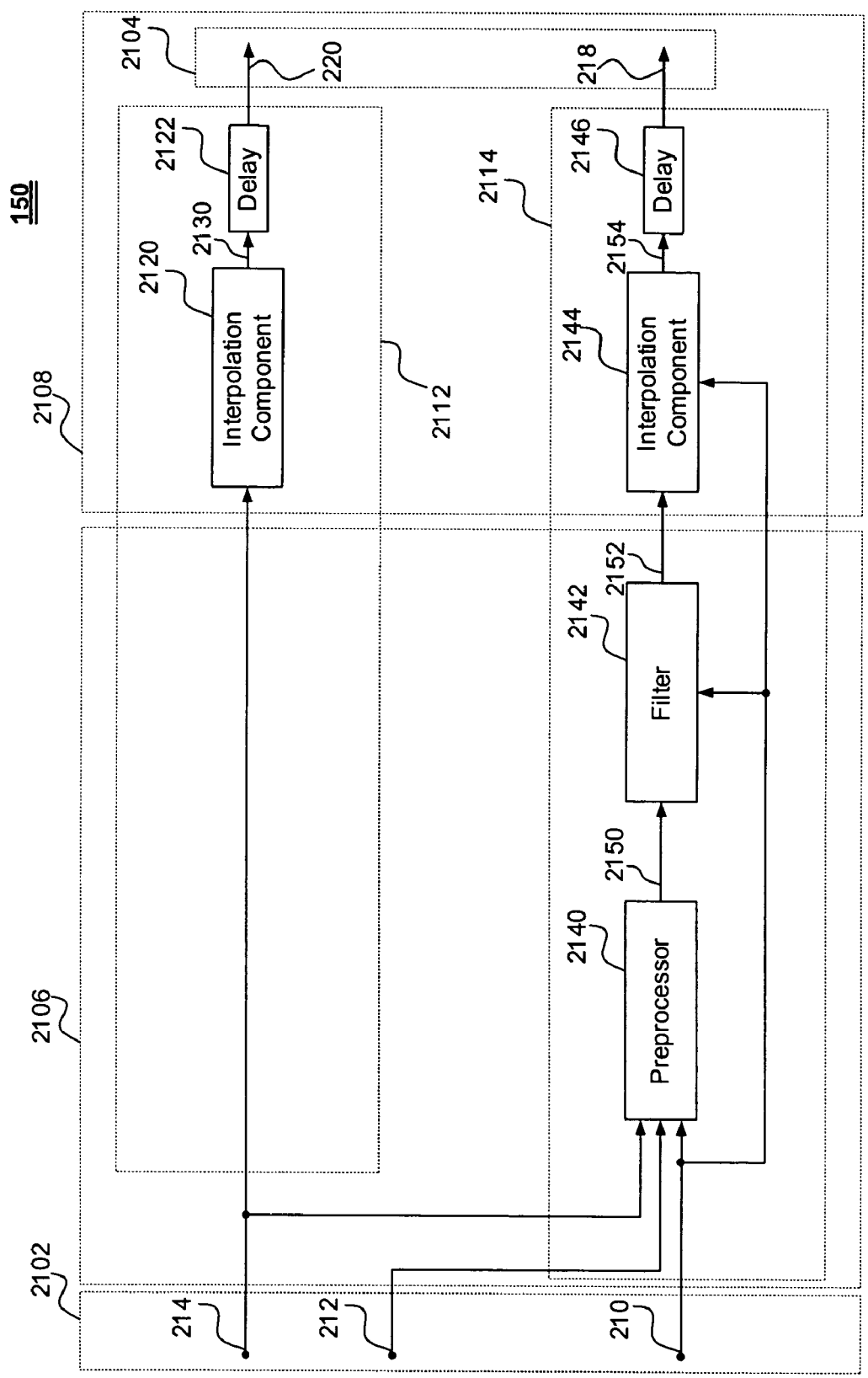
FIG. 21 is a block diagram illustrating a profile executor and its components, according to an embodiment of the invention.

FIG. 21 is a block diagram of an implementation of profile executor 150. Executor 150 includes a state signal interface 2102, an output signal interface 2104, a slow clock portion 2106, and a fast clock portion 2108. State signal interface 2102 receives trajectory data 140 from trajectory planner 130. As described above with respect to FIG. 2, trajectory data 140 comprises position state signal 210, velocity state signal 212, and acceleration state signal 214 Output signal interface 2104 sends execution data 160 to control system 170.

Spanning slow and fast clock portions 2106 and 2108 are an acceleration signal path 2112 and a position signal path 2114. Acceleration signal path 2112 receives acceleration state signal 214 from state signal interface 2102 and generates acceleration output signal 220. Position signal path 2114 receives state signals 210, 212, and 214 (i.e., trajectory data 140) from state signal interface 2102. Based on these received signals, position signal path 2114 generates position output signal 218.

Both acceleration signal path 2112 and position signal path 2114 include a plurality of signal processing elements. These elements perform operations, such as filtering, upsampling, and signal delaying. These elements also perform interpolation of input state signals. For signal paths 2112 and 2114, this interpolation results in output signals 218 and 220 having the same clock rate.

Position signal path 2114 includes a preprocessing component 2140, a pre-interpolation filter 2142, an interpolation component 2144, and a time delay component 2146. As described above, position signal path 2114 receives trajectory data in the form of state signals 210, 212, and 214, and generates position output signal 218.

Pre-processing component 2140 receives position state signal 210, velocity state signal 212, and acceleration state signal 214. These signals are processed to generate an integrated position signal 2150, which is at the slow clock rate. Integrated position signal 2150 is based on acceleration state signal 214, velocity state signal 212 and position state signal 210. To generate integrated position signal 2150, preprocessing component 2140 performs a discrete time integration operation, $$P_n = P_i + nT^*[V_i + (nT^*A/2)]$$

As described above, $P_n$ represents integrated position signal 2150, $P_i$ represents position state signal 210, $V_i$ represents an velocity state signal 212, n is an integer representing a sample time at the slow clock rate, T is the slow clock period, and A represents acceleration state signal 214.

Pre-interpolation filter 2142 receives position state signal 210, and integrated position signal 2150. Pre-interpolation filter 2142 processes these signals to generate filtered position signal 2152. By generating filtered position signal 2152, pre-interpolation filter 2142 filters integrated position signal 2150 to limit the frequency content of signal 2152 before it is sent to interpolation component 2144. Pre-interpolation filter 2140 employs FIR filtering techniques that run at the slow clock rate. However, pre-interpolation filter 2140 can employ other types of discrete time filtering techniques, such as IIR filtering.

Interpolation component to 2144 receives filtered position signal 2152 and position state signal 210. Upon receipt of these signals, interpolation component 2144 performs two functions. First, interpolation component 2144 performs an upsampling operation to create a signal that is at the fast clock rate. This upsampling operation involves inserting L-1 zeros between each sample where L is the interpolation rate.

Second, interpolation component 2144 performs a filtering operation on the upsampled signal. This filtering operation prevents high frequency resonance components from being introduced by the upsampling function. The filtering is performed using a low-pass FIR filtering operation. However, other types of filtering, such as IIR filtering can be employed. Together, these upsampling and filtering operations are collectively referred to herein as interpolation. The result of this interpolation operation results in an interpolated position signal 2154, which is sent to time delay component 2146.

Both pre-interpolation filter 2142 and interpolation component 2144 employ "delta processing" techniques to increase the precision of the filtering and interpolation operations that they perform. These delta processing techniques are described below in greater detail with reference to FIGS. 22 and 23.

Time delay component 2146 receives interpolated position signal 2154. This component operates at the fast clock rate and enables the propagation time and phase of position signal path 2114 to be adjusted. Time delay component 2146 generates position signal 218 and sends it to output signal interface 2104.

The description now turns to acceleration signal path 2112. Acceleration signal path 2112 includes an interpolation component 2120, and a time delay component 2122. Acceleration signal path 2112 receives acceleration state signal 214 from state signal interface 2102 and generates acceleration output signal 220.

Interpolation component 2120, like interpolation component 2144, performs two functions. First, interpolation component 2120 upsamples signal acceleration state signal 214 at an interpolation rate of L. Second, interpolation component 2120 performs a filtering operation on this upsampled data. This filtering operation prevents high frequency resonance components from being introduced by the upsampling function. As a result of these functions, interpolation component 2120 produces an interpolated acceleration signal 2130 that is transferred to time delay component 2122.

Time delay component 2122 receives interpolated acceleration signal 2130 and enables the propagation time and phase of acceleration signal path 2112 to be adjusted. By incurring such delays, time delay component 2122 generates acceleration output signal 220, which is sent to output interface 2104.

Delta Processing

Elements of profile executor 150, such as filter 2142 and interpolation component 2144 employ a delta processing feature. This feature reduces computational errors in output signals, such as position output signal 218. Delta processing involves subtracting position state signal 210 from time varying signals that represent an absolute position. This subtraction results in "delta signals" that have a smaller dynamic range than the corresponding signals that represent an absolute position.

Figure 22:
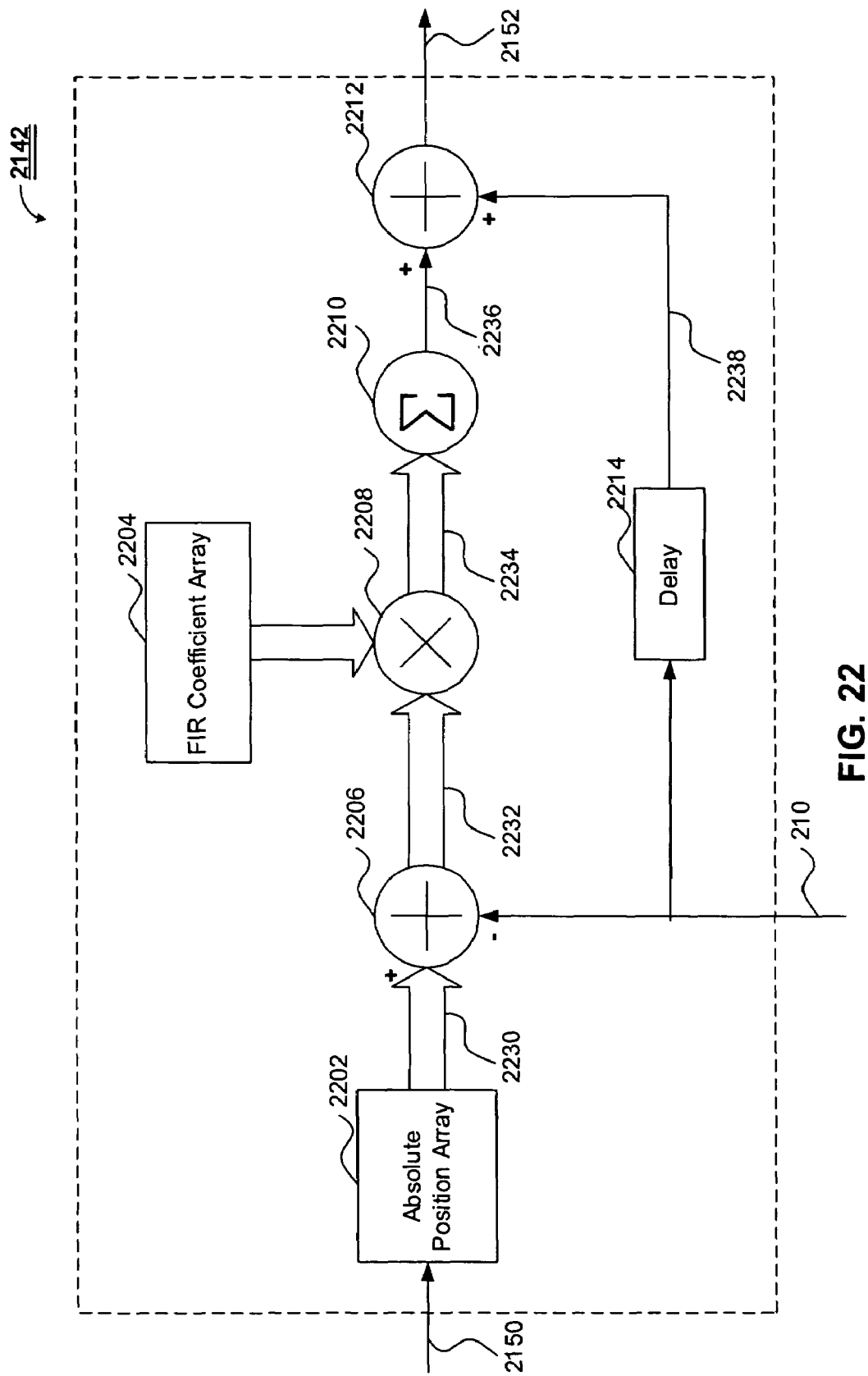
FIG. 22 is a block diagram illustrating a filter for an integrated position signal, according to an embodiment of the invention.

FIG. 22 is a block diagram illustrating an implementation of filter 2142 that employs delta processing. This implementation includes an absolute position array 2202, an FIR coefficient array 2204, a first scalar summation node 2206, a vector product node 2208, a vector summation node 2210, a second scalar summation node 2212, and a delay module 2214.

Absolute position array 2202 receives an input signal (i.e., integrated position signal 2150) from preprocessing component 2140. Absolute position array 2202 processes the integrated position signal to provide a parallel position signal set 2230. Parallel position signal set 2230 includes a plurality of discrete time signals. For each of the discrete time steps, these signals include a plurality of contiguous values selected from signal 2150. Thus, through parallel position signal set 2230, absolute position array 2202 concurrently sends scalar summation node 2106 a plurality of contiguous values from signal 2150.

Scalar summation node 2206 receives parallel position signal set 2230 and position state signal 210. Scalar summation node 2206 subtracts position state signal 210 from each of the signals within parallel signal set 2230. This subtraction produces a delta parallel signal set 2232, which is sent to vector product node 2208. Signal set 2232 has a delta magnitude scale. This scale is smaller than the absolute magnitude scale of signal set 2230.

Vector product node 2208 performs an element-by-element multiplication on delta parallel signal set 2232 and a plurality of FIR filter coefficients that are stored in FIR coefficient array 2204. This multiplication produces a parallel product signal set 2234, which is sent to vector summation node 2210.

Vector summation node 2210 sums each of the signals within parallel product signal set 2234. This summation results in a single (i.e., a scalar) delta filtered signal 2236.

Scalar summation node 2212 receives delta filtered signal 2236 and a delayed position state signal 2238. Delayed position state signal 2238 is position state signal 210 that is delayed a predetermined delay time by delay module 2214. This predetermined delay time matches the propagation delays associated with the above described transfer of signals between summations node 2206 and 2212.

Scalar summation node 2212 adds delta filtered signal 2236 and delayed position state signal 2238, thereby producing filtered position signal 2152. This addition returns filtered signal 2236 from a delta scale to an absolute scale. As described herein, filtered position signal 2152 is sent to interpolation component 2144.

The delta processing approach of this implementation enables filter 2142 to minimize round up errors incurred by computations (i.e., summations and multiplications) that are associated with filtering operations. This error minimization is achieved through the subtraction of position state signal 210 from parallel position signal set 2230 at scalar summation node 2206. This subtraction results in signal set 2232, which has a smaller magnitude than signal set 2230.

In fixed precision processing environments, round up error due to fixed precision numeric representations are a direct function of the magnitude of input signals. By reducing the magnitude of input signals, as in delta parallel signal set 2232, the computations performed at nodes 2208 and 2210 are minimized. This minimization yields an output signal (i.e., filtered position signal 2152) that has smaller errors.

Figure 23:
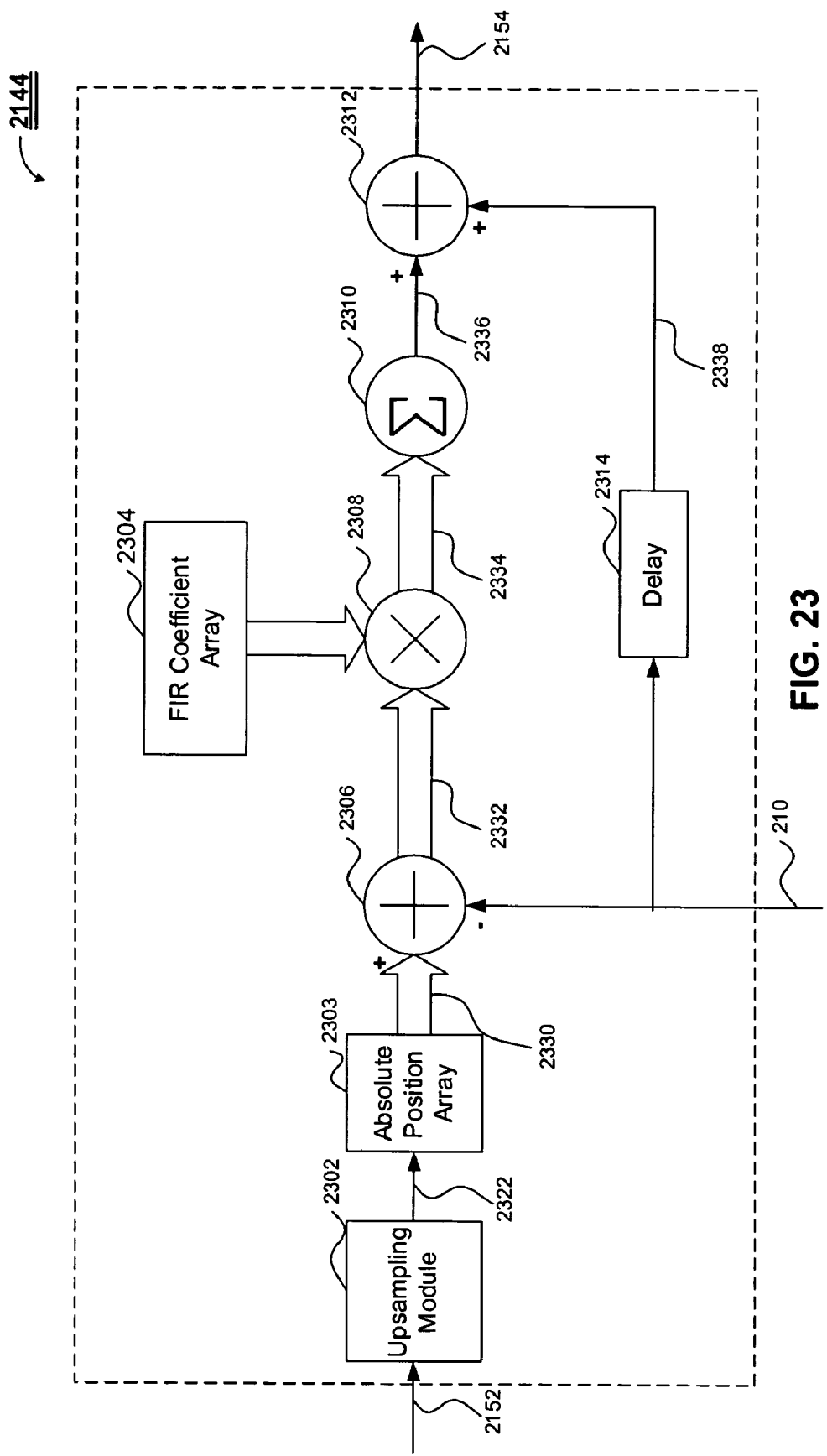
FIG. 23 is a block diagram illustrating an interpolation component of a profile executor, according to an embodiment of the invention.

FIG. 23 is a block diagram illustrating an implementation 500 of interpolation component 2144. This implementation is similar to the above implementation. However, this implementation includes an upsampling module 2302 that increases the sampling rate of an input signal (i.e., filtered position signal 2152), thereby producing an upsampled signal 2322, which is sent to absolute position array 2303. This implementation also receives position state signal 210 in order to employ the delta processing feature that is described above with reference to FIG. 22. Thus, as in FIG. 21, the delta processing technique employed by this implementation component produces an output signal (i.e., interpolated signal 2154) that has smaller errors.

Thus, the present invention includes a technique for efficiently processing a discrete time input signal, p(n), having a first clock rate into a discrete time output signal having a second clock rate. This technique minimizes computational errors.

III. Conclusion

While various embodiments of the present invention have been described above, it should be understood that they have been presented by way of example, and not limitation. It will be apparent to persons skilled in the relevant art that various changes in detail can be made therein without departing from the spirit and scope of the invention. Thus the present invention should not be limited by any of the above-described exemplary embodiments.

What is claimed is:

1. A method of operating a lithography system component along a multi-axis trajectory, comprising:
 calculating a preliminary motion trajectory for each axis;
 synchronizing motion across the axes;
 inserting time delays at a start of the preliminary motion trajectory for each axis to compensate for filter delays; and
 moving the lithography system component in accordance with the preliminary motion trajectory having the inserted time delays.

2. The method of claim 1, wherein the moving lithography system component is a wafer stage.

3. The method of claim 1, wherein the moving lithography system component is a reticle stage.

4. The method of claim 1, wherein the calculating step comprises:
adjusting a constant velocity scan length to account for filter width, settling time, and quantization;
computing acceleration intervals between consecutive constant velocity scans;
creating a zero velocity point between the consecutive constant velocity scans; and
quantizing the acceleration intervals.

5. The method of claim 4, wherein the computing step comprises:
calculating an optimal velocity profile for each axis; and
calculating transition times between consecutive constant velocity scans.

6. The method of claim 5, wherein the computing step further comprises:
constraining the optimal velocity profile according to maximum velocity or maximum acceleration limits when the limits are exceeded.

7. The method of claim 4, wherein the creating step comprises:
breaking the trajectory into two sub-optimal segments when a trajectory between scans either starts or ends at zero velocity or has no reversal point,
wherein the first sub-optimal segment ends with zero velocity, and the second sub-optimal segment begins with zero-velocity.

8. The method of claim 4, wherein the creating step comprises:
calculating a reversal point and splitting the trajectory at the reversal point into two segments, wherein a velocity is zero at the reversal point.

9. The method of claim 1, wherein the synchronizing step comprises:
adjusting zero velocity time intervals in the preliminary motion trajectories.

10. The method of claim 9, wherein the adjusting step comprises:
identifying a non-critical axis trajectory;
calculating a time difference between a critical axis trajectory and the non-critical axis trajectory; and
introducing a delay, equal to the time difference, at a zero velocity point of the non-critical axis trajectory.

11. The method of claim 1, further comprising:
inserting an additional delay at a start of an axis trajectory to compensate for filter delays.

12. A method of operating a lithography system component along a multi-axis trajectory, comprising:
calculating a preliminary motion trajectory for each axis;
synchronizing motion across the axes;
inserting time delays at a start of the preliminary motion trajectory for each axis to compensate for filter delays;
inserting a delay at a start of an axis trajectory to compensate for filter delays; and
moving the lithography system component in accordance with the preliminary motion trajectory having the inserted time delays, wherein the step of inserting a delay at a start of an axis trajectory step comprises:
identifying an axis of trajectory with a longest execution filter delay;
identifying an axis trajectory with a shorter execution filter delay;
calculating the difference between the execution filter delays; and
introducing a matching delay, equal to the difference between the execution filter delays, into the axis trajectory with the shorter execution filter delay.

13. A method, comprising:
determining a preliminary motion trajectory for each axis;
synchronizing motion across the axes;
inserting time delays at a start of the preliminary motion trajectory for each axis to compensate for filter delays, wherein the step of inserting comprises:
identifying an axis of trajectory with a longest execution filter delay,
identifying an axis trajectory with a shorter execution filter delay,
calculating the difference between the execution filter delays, and
introducing a matching delay, equal to the difference between the execution filter delays, into the axis trajectory with the shorter execution filter delay; and
moving a lithography system component in accordance with the preliminary motion trajectory having the inserted time delays.

14. The method of claim 13, wherein the synchronizing step comprises:
adjusting zero velocity time intervals in a preliminary motion of the lithography system component along the multi-axis trajectory.

15. The method of claim 13, wherein the calculating step comprises:
adjusting a constant velocity scan length to account for filter width, settling time, and quantization;
computing acceleration intervals between consecutive constant velocity scans;
creating a zero velocity point between the consecutive constant velocity scans; and
quantizing the acceleration intervals.

16. The method of claim 15, wherein the computing step comprises:
calculating an optimal velocity profile for each axis; and
calculating transition times between consecutive constant velocity scans.

17. The method of claim 15, wherein the computing step further comprises:
constraining the optimal velocity profile according to maximum velocity or maximum acceleration limits when the limits are exceeded.

18. The method of claim 13, wherein the moving lithography system component is a wafer stage.

19. The method of claim 13, wherein the moving lithography system component is a reticle stage.

* * * * *

UNITED STATES PATENT AND TRADEMARK OFFICE
CERTIFICATE OF CORRECTION

PATENT NO. : 7,389,155 B2 Page 1 of 1
APPLICATION NO. : 11/002429
DATED : June 17, 2008
INVENTOR(S) : Galburt et al.

It is certified that error appears in the above-identified patent and that said Letters Patent is hereby corrected as shown below:

Title Page
Item (*), Notice section missing Terminal Disclaimer please add to end of section
--This patent is subject to a terminal disclaimer.--.

Signed and Sealed this

Twenty-sixth Day of August, 2008

JON W. DUDAS
*Director of the United States Patent and Trademark Office*